United States Patent
Bonora et al.

(10) Patent No.: US 10,755,960 B2
(45) Date of Patent: Aug. 25, 2020

(54) WAFER ALIGNER

(71) Applicant: Brooks Automation, Inc., Chelmsford, MA (US)

(72) Inventors: Anthony C. Bonora, Portola Valley, CA (US); Justo Graciano, Hayward, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 794 days.

(21) Appl. No.: 14/928,352

(22) Filed: Oct. 30, 2015

(65) Prior Publication Data
US 2016/0126128 A1 May 5, 2016

Related U.S. Application Data

(60) Provisional application No. 62/075,014, filed on Nov. 4, 2014.

(51) Int. Cl.
*H01L 21/687* (2006.01)
*H01L 21/68* (2006.01)
(Continued)

(52) U.S. Cl.
CPC .... *H01L 21/68707* (2013.01); *H01L 21/6715* (2013.01); *H01L 21/67017* (2013.01);
(Continued)

(58) Field of Classification Search
CPC ................................................ H01L 21/68707
See application file for complete search history.

(56) References Cited

U.S. PATENT DOCUMENTS 6,002,840 A * 12/1999 Hofmeister ....... H01L 21/67265
700/245
6,195,619 B1 * 2/2001 Ren ...................... G03F 7/7075
414/744.5
(Continued)

FOREIGN PATENT DOCUMENTS

JP  2000058625  2/2000
JP  2002217268  8/2002
(Continued)

OTHER PUBLICATIONS

International Search Report, International Application No. PCT/US2015/058556, dated Dec. 22, 2015.

*Primary Examiner* — Saul Rodriguez
*Assistant Examiner* — Willie Berry, Jr.
(74) *Attorney, Agent, or Firm* — Perman & Green, LLP; Colin C. Durham

(57) ABSTRACT

A semiconductor wafer transport apparatus includes a frame, a transport arm movably mounted to the frame and having at least one end effector movably mounted to the arm so the at least one end effector traverses, with the arm as a unit, in a first direction relative to the frame, and traverses linearly, relative to the transport arm, in a second direction, and an edge detection sensor mounted to the transport arm so the edge detection sensor moves with the transport arm as a unit relative to the frame, the edge detection sensor being a common sensor effecting edge detection of each wafer simultaneously supported by the end effector, wherein the edge detection sensor is configured so the edge detection of each wafer is effected by and coincident with the traverse in the second direction of each end effector on the transport arm.

19 Claims, 24 Drawing Sheets

(51) Int. Cl.
*H01L 21/67* (2006.01)
*H01L 23/544* (2006.01)

(52) U.S. Cl.
CPC .. *H01L 21/67173* (2013.01); *H01L 21/67178* (2013.01); *H01L 21/67259* (2013.01); *H01L 21/681* (2013.01); *H01L 21/682* (2013.01); *H01L 23/544* (2013.01); *H01L 2223/54406* (2013.01); *H01L 2223/54433* (2013.01); *H01L 2924/0002* (2013.01)

(56) References Cited

U.S. PATENT DOCUMENTS

| | | |
|---|---|---|
| 2003/0111912 A1 | 6/2003 | Binnard et al. |
| 2004/0091343 A1 | 5/2004 | Astegno et al. |
| 2009/0142163 A1* | 6/2009 | Genetti ............ H01L 21/67196 414/217 |
| 2014/0023776 A1 | 1/2014 | Kuwahara et al. |

FOREIGN PATENT DOCUMENTS

| | | |
|---|---|---|
| JP | 2009021504 | 1/2009 |
| JP | 2014022589 | 2/2014 |
| WO | 9962107 | 12/1999 |
| WO | 03007345 | 1/2003 |
| WO | 2010111781 | 10/2010 |

\* cited by examiner

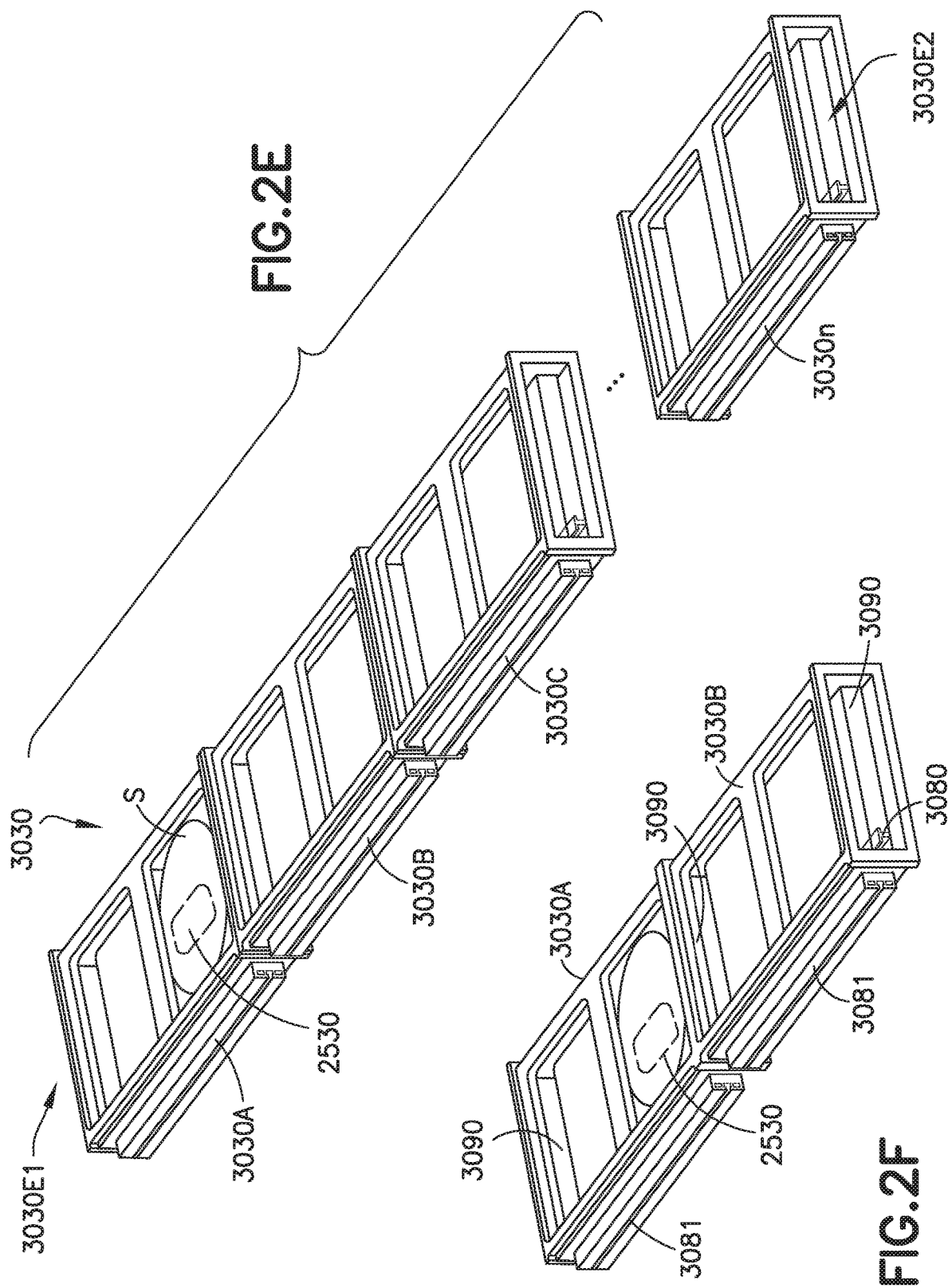

| CONVENTIONAL TRANSFER TIMES | TRANSFER TIMES |
|---|---|
| | |
| PICK WAFER FROM CASSETTE | PICK WAFER FROM CASSETTE |
| TRANSFER WAFER FROM CASSETTE TO FIXED ALIGNER | TRANSFER WAFER FROM CASSETTE TO HOLDING LOCATION** WITH ON-THE-FLY ALIGN/READ |
| PLACE WAFER AT FIXED ALIGNER | PLACE WAFER AT HOLDING LOCATION** |
| ALIGN/READ WAFER | |
| PICK WAFER FROM FIXED ALIGNER | |
| TRANSFER WAFER FROM FIXED ALIGNER TO LOAD LOCK | |
| PLACE WAFER AT LOAD LOCK | |

** THE HOLDING LOCATION IS ONE OR MORE OF THE CASSETTE AT THE LOAD PORT FROM WHICH THE WAFER WAS REMOVED, A DIFFERENT CASSETTE AT AN ADJACENT LOAD PORT, AND A LOAD LOCK.

FIG.9

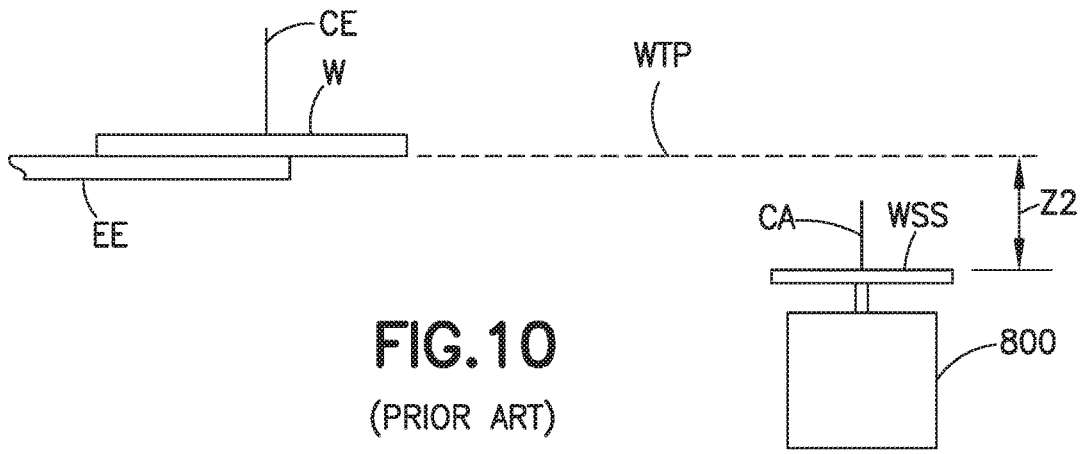

FIG.10
(PRIOR ART)

WAFER ALIGNER

CROSS REFERENCE TO RELATED APPLICATIONS

This application is a non-provisional of and claims the benefit of U.S. provisional patent application No. 62/075,014 filed on Nov. 4, 2014, the disclosure of which is incorporated herein by reference in its entirety.

BACKGROUND

1. Field

The exemplary embodiments generally relate to wafer processing systems and, more particularly, to wafer alignment.

2. Brief Description of Related Developments

Generally conventional semiconductor processing equipment utilizes specialized stand-alone wafer aligners to provide alignment functions and wafer identification functions during semiconductor processing. These specialized stand-alone wafer aligners are generally mounted at one end (e.g. on a side) of an equipment front end module (EFEM) enclosure or the enclosure of a wafer sorter (it is noted that the EFEM may include a sorting function).

Placement of the specialized stand-alone wafer aligners on the end of the EFEM generally requires significant wafer transport robot travel time and waiting time to allow the specialized stand-alone wafer aligners to perform wafer alignment and wafer identification. The wafer transport robot travel and waiting times result in an excessive cycle time (e.g. to transfer a wafer from, for example, a wafer cassette to another wafer holding station such as a load lock) and may greatly reduce the number of wafers per hour (e.g. throughput) that may be processed through the EFEM.

The location of the specialized stand-alone wafer aligners at the end of the EFEM generally requires a protruding "bumpout enclosure" (e.g. a boxlike enclosure that extends outward from the side of the EFEM). These bumpout enclosures increase the overall tool footprint and add to the manufacturing cost for the EFEM and/or wafer sorter. The bumpout enclosures also create cleanliness challenges because the flow of ultra-low particulate air through the EFEM and/or wafer sorter to control internal airborne cleanliness is compromised by lateral non-laminar flow patterns encountered with the bumpout enclosures.

It would be advantageous to have on-the-fly wafer alignment and identification within an EFEM and/or sorter that addresses the above-described issues with the specialized stand-alone wafer aligners.

BRIEF DESCRIPTION OF THE DRAWINGS

The foregoing aspects and other features of the disclosed embodiment are explained in the following description, taken in connection with the accompanying drawings, wherein:

FIGS. 2A-2G are schematic illustrations of processing apparatus incorporating aspects of the disclosed embodiment;

FIG. 9 is a table illustrating transfer operations corresponding to conventional wafer transport times corresponding to the transport paths of FIG. 8A and transfer operations corresponding to wafer transport times in accordance with the aspects of the disclosed embodiment corresponding to the transport paths of FIG. 8B; and FIG. 10 is a schematic illustration of a portion of a conventional processing tool.

DETAILED DESCRIPTION

Figure 1A:
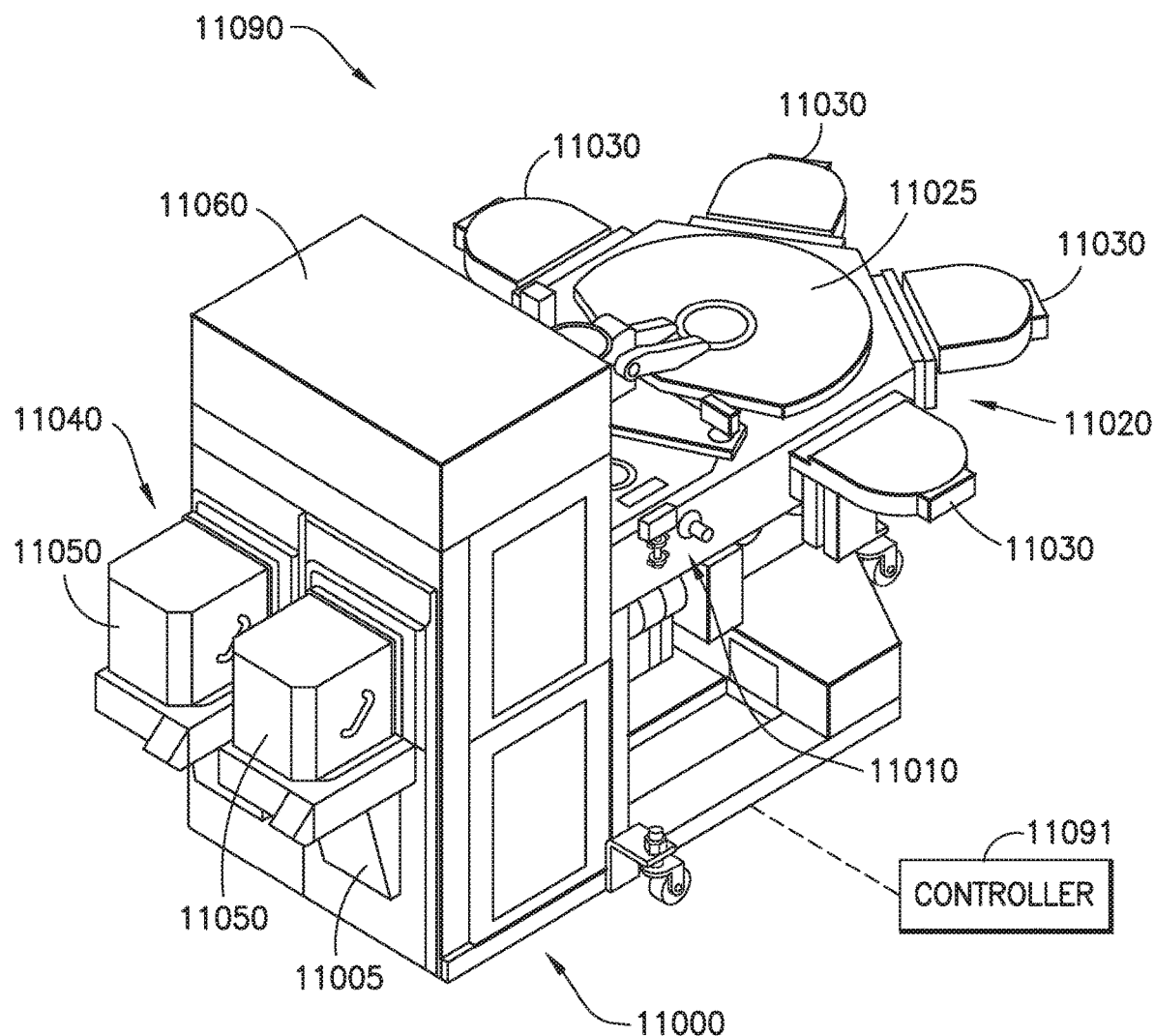
FIGS. 1A-1D are schematic illustrations of processing apparatus incorporating aspects of the disclosed embodiment.

Referring to FIGS. 1A-1D and 2A-2G, there are shown schematic views of wafer processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used. It should be understood that the figures are merely representative in nature and the features depicted therein are exemplary and presented for descriptive purposes and, unless expressly stated otherwise, may be varied as desired.

As will be described in greater detail below, the aspects of the disclosed embodiment provide for on-the-fly wafer/substrate alignment system 499 (FIG. 4D) through the integration of a wafer spinner (e.g. with a rotary drive to rotate the wafer at least partially, otherwise referred to herein for convenience as an aligner) with a semiconductor wafer transport apparatus. Here on-the-fly alignment refers to the alignment of one or more wafers during transport of the one or more wafers by the transport apparatus or only of a portion thereof, such as the end effector(s) holding the wafer(s) as will be described further below. For example, the aspects of the disclosed embodiment enable a physical alignment of the one or more wafers without the transfer robot transferring the wafer to a fixed wafer alignment station/module, or wafer alignment station/module with a corresponding frame of reference different than the transfer robot. The aspects of the disclosed embodiment described herein provide the transport and aligner on a common platform and hence a common frame of reference. As will be seen from the description below, the aspects of the disclosed embodiment are, in one aspect employed within an atmospheric environment, such as in equipment front end modules (EFEMs) (e.g. an enclosure with a load port as a base configuration) and wafer sorters, while in other aspects are employed in a vacuum environment, such as in a transfer chamber of a cluster tool and a linear transfer chamber of a linear tool or a combination thereof. In still other aspects the disclosed embodiment is employed in any suitable wafer transport apparatus having, for example, a long travel distance for wafers in one or more of the X and Z axes (the X, Y and Z axes described herein are for exemplar purposes only and in other aspects the different directions are represented by any suitable nomenclature). As will be seen below, the aspects of the disclosed embodiment provide for higher wafer throughput, improved wafer cleanliness, minimum environmental disturbance within the enclosing module, more accurate wafer alignment, reduced manufacturing cost and smaller tool footprint (e.g. by eliminating the bumpout enclosure of conventional systems) and improves serviceability. The aspects of the disclosed embodiment are also compatible with any suitable end effector (e.g. active edge grip, vacuum grip, passive/friction supports, etc.) and allow for a common control architecture between wafer alignment and transport robot control.

Figure 1B:
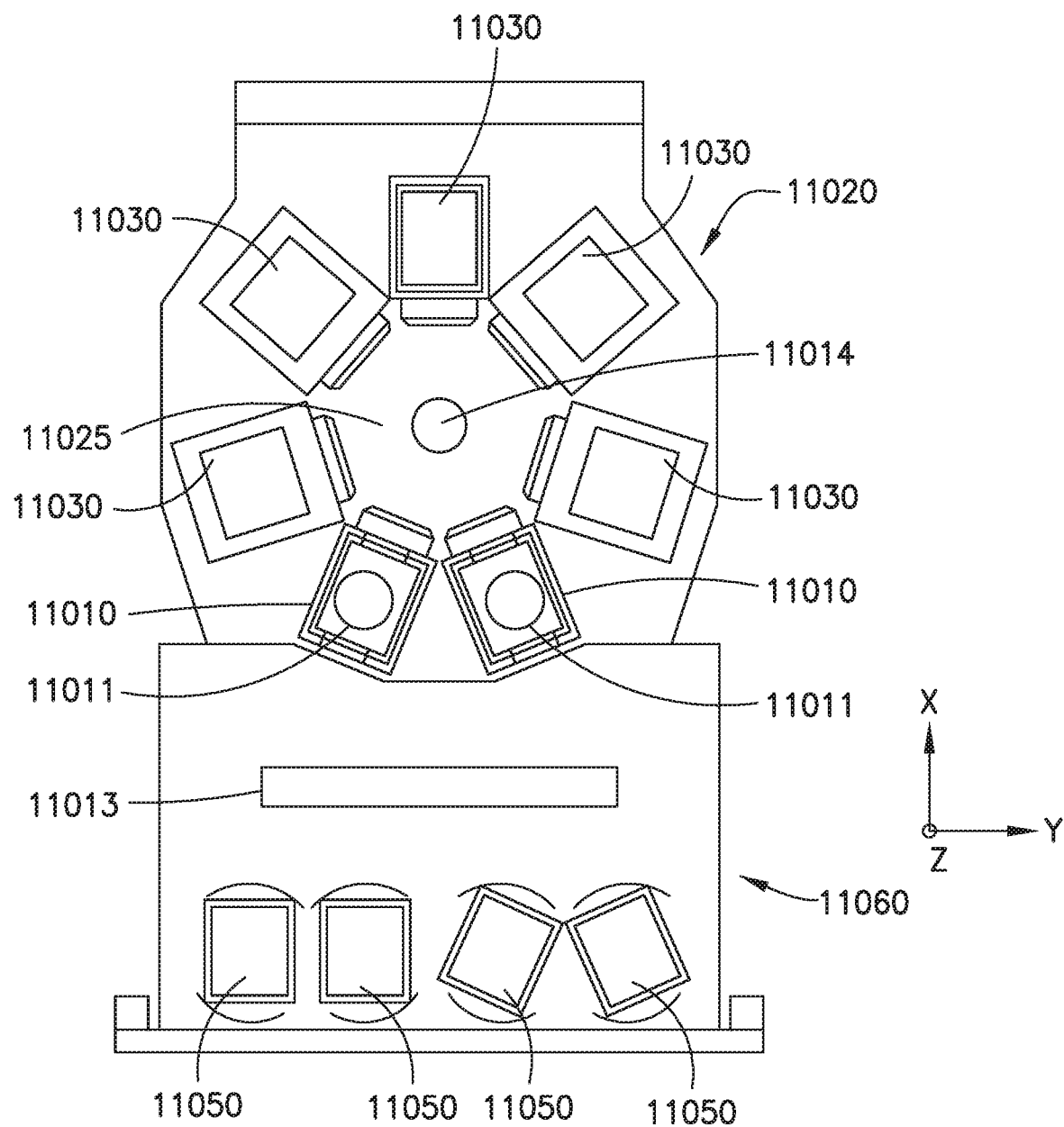

Referring to FIGS. 1A and 1B, a processing apparatus, such as for example a semiconductor tool station 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 11000 generally includes load port modules 11005 and a mini-environment 11060 such as for example an equipment front end module (EFEM) (which in some aspects includes a wafer sorting function). In other aspects the processing stations include wafer buffers, wafer inverters and wafer shuffle stations (which may be located in the vacuum back end 11020, in the front end 11000 and/or connecting the front end 11000 with vacuum the back end 11020 (e.g. such as in a load lock). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable wafer interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive wafer carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of wafers between the wafer cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. Nos. 6,002,840 and 7,066,707, the disclosures of which are incorporated by reference herein in their entireties or in other aspects, any other suitable transport robot having any suitable configuration. The mini-environment 11060 may provide a controlled, clean zone for wafer transfer between multiple load port modules.

The vacuum load lock 11010 may be located between and connected to the mini-environment 11060 and the back end 11020. It is noted that the term vacuum as used herein denotes a high vacuum such as $10^{-5}$ Torr or below in which the wafers are processed. The load lock 11010 generally includes atmospheric and vacuum slot valves. The slot valves may provide the environmental isolation employed to evacuate the load lock after loading a wafer from the atmospheric front end and to maintain the vacuum in the transport chamber when venting the lock with an inert gas such as nitrogen. In one aspect, the load lock 11010 includes an aligner 11011 for aligning a fiducial of the wafer to a desired position for processing, while in other aspects alignment of the wafer is effected with the transfer robot as described herein. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot 11014. The transfer robot 11014 will be described below and may be located within the transport chamber 11025 to transport wafers between the load lock 11010 and the various processing stations 11030. The processing stations 11030 may operate on the wafers through various deposition, etching, or other types of processes to form electrical circuitry or other desired structure on the wafers. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow wafers to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a process module 11030 (e.g. the processing vacuum and/or vacuum environment extends between and is common between the process module 11030 and the cassette 11050).

Figure 1C:
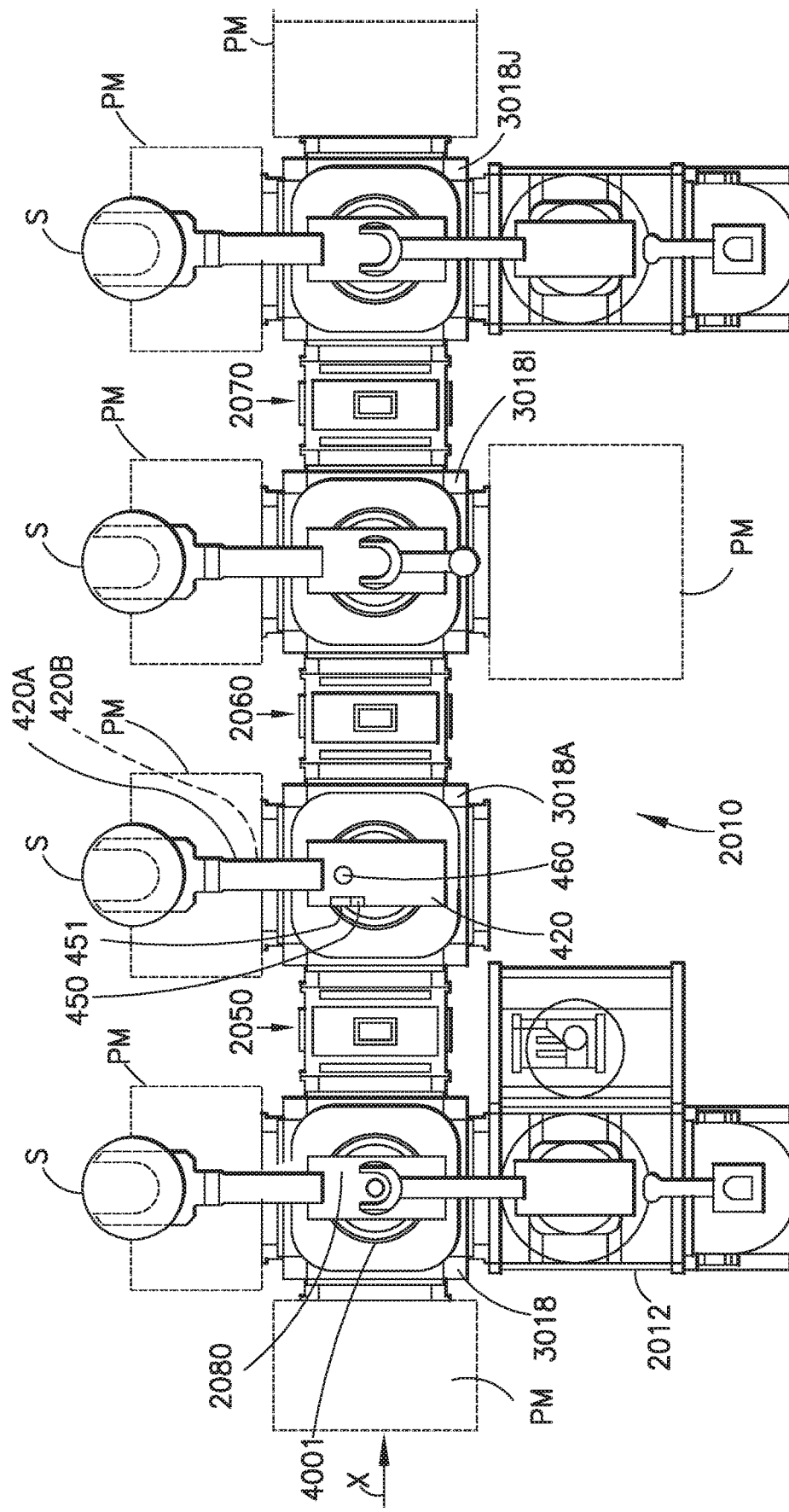

Referring now to FIG. 1C, a schematic plan view of a linear wafer processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 30181, 3018J to interfaces 2050, 2060, 2070 as described in U.S. Pat. No. 8,398,355, previously incorporated herein by reference. Each transport chamber module 3018, 3018A, 30181, 3018J includes any suitable wafer transport 2080, which may include one or more aspects of the disclosed embodiment described herein, for transporting wafers throughout the processing system 2010 and into and out of, for example, processing modules PM. As may be realized, each chamber module may be capable of holding an isolated or controlled atmosphere (e.g. N2, clean air, vacuum).

Figure 1D:
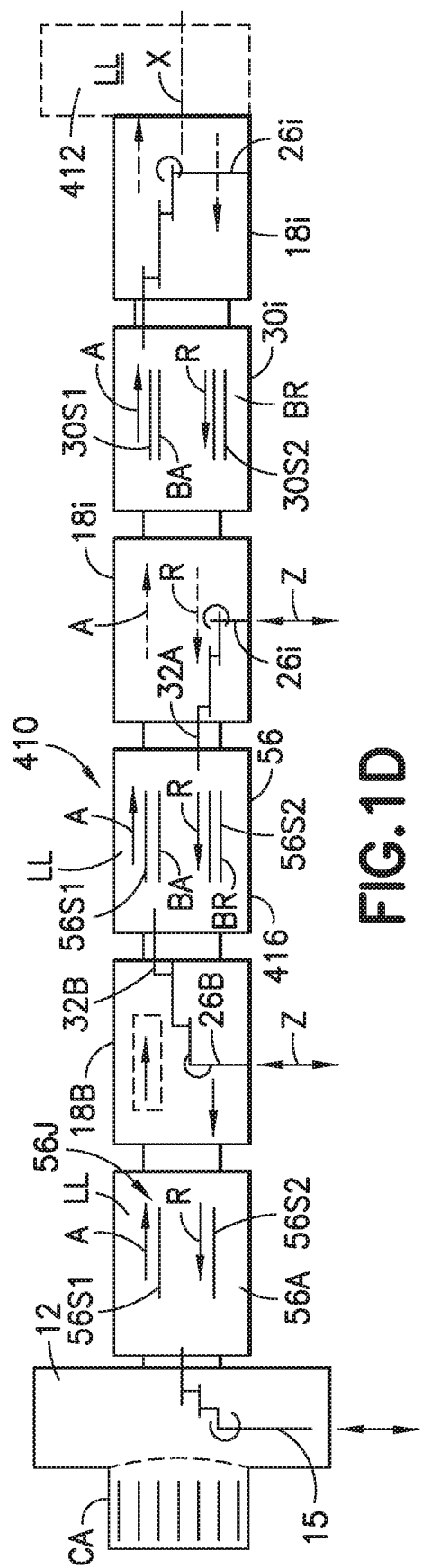

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system 420 in the transport chamber. In this aspect, the transport apparatus 26B may have a general SCARA arm configuration (though in other aspects the transport arms may have any other desired arrangement such as, for example, an arrangement substantially similar to the transport apparatus 11013, 11014 of the cluster tool illustrated in FIGS. 1A and 1B, a linearly sliding arm 214 as shown in FIG. 2I or other suitable arm having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design, such as a Cartesian linearly sliding arm, wherein any such design configuration also includes the slide body 420, alignment system 499 and end effector(s) 420A, 420B . . . 420n as described further herein. For example in one aspect the slide body 420 is mounted to an arm link of any suitable articulated transport arm. Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2H) configuration, a leap frog arm 217 (FIG. 2K) configuration, a bi-symmetric arm 218 (FIG. 2J) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

In the aspect of the disclosed embodiment shown in FIG. 1D, the arms and/or end effectors of the transport apparatus 26B may be arranged to provide what may be referred to as fast swap arrangement allowing the transport to quickly swap wafers from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S, 56S1, 56S2, 30S1, 30S2 that cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Referring now to FIGS. 2A-2D the processing tool is illustrated as a linear processing tool 3000, 3000A, 3000B, 3000C having more than one cluster workstations 3010-3013 each having one or more transfer chambers 3001-3003 and a plurality of processing modules 11030 (e.g. a combination linear cluster tool). In one aspect the linear processing tool 3000, 3000A, 3000B, 3000C is substantially similar to those described in U.S. patent application Ser. No. 14/377,987 filed on Aug. 11, 2014 entitled "Substrate Processing Apparatus" the disclosure of which is incorporated herein by reference in its entirety. In one aspect the cluster workstations 3010-3013 are substantially similar to the back end 11020 described above. The cluster workstations 3010-3013 are connected to each other by one or more transfer chambers 3020, 3021 and one or more linear transfer tunnels 3030. As may be realized, each of the transfer chambers 3020, 3021 includes a transport robot 3023. As may also be realized, referring to FIGS. 2E-2G, the linear transfer tunnel 3030 is in one aspect formed of tunnel modules that are connected to each other to form a common tunnel and having one or more transport robots 3033 disposed therein and configured to traverse a length of the common tunnel. For example, the linear transfer tunnel 3030 is a vacuum tunnel that includes one or more vacuum tunnel modules 3030A-3030n that may be sealingly coupled together to form a vacuum tunnel having any suitable length. Each vacuum tunnel module 3030A-3030n includes a connection port 3090 at each end of the vacuum tunnel module 3030A-3030n to allow connection of the vacuum tunnel modules to each other and/or any other suitable module of the processing tool described herein. In this aspect, each vacuum tunnel module 3030A-3030n includes at least one transport cart guide 3080 and at least one motor component 3081 for driving at least one transport cart 2530 (which includes aspects of the disclosed embodiment as described herein) through a respective vacuum tunnel module 3030A-3030n. It is noted that the ports 3090 are sized to allow passage of the transport carts through the ports. As may be realized, when two or more vacuum tunnel modules 3030A-3030n are coupled to each other the at least one transport cart guide 3080 of each vacuum chamber module 3030A-3030n form a substantially continuous transport cart guide that extends through the vacuum tunnel 3030 for allowing passage of the transport cart 2530 between longitudinal ends 3030E1, 3030E2 of the vacuum tunnel 3030. The at least one motor component 3081 of each of the vacuum chamber modules 3030A-3030n also form a substantially continuous motor component that allows for substantially continuous driving movement of the transport cart between the ends 3030E1, 3030E2 of the vacuum tunnel 3030.

Figure 2A:
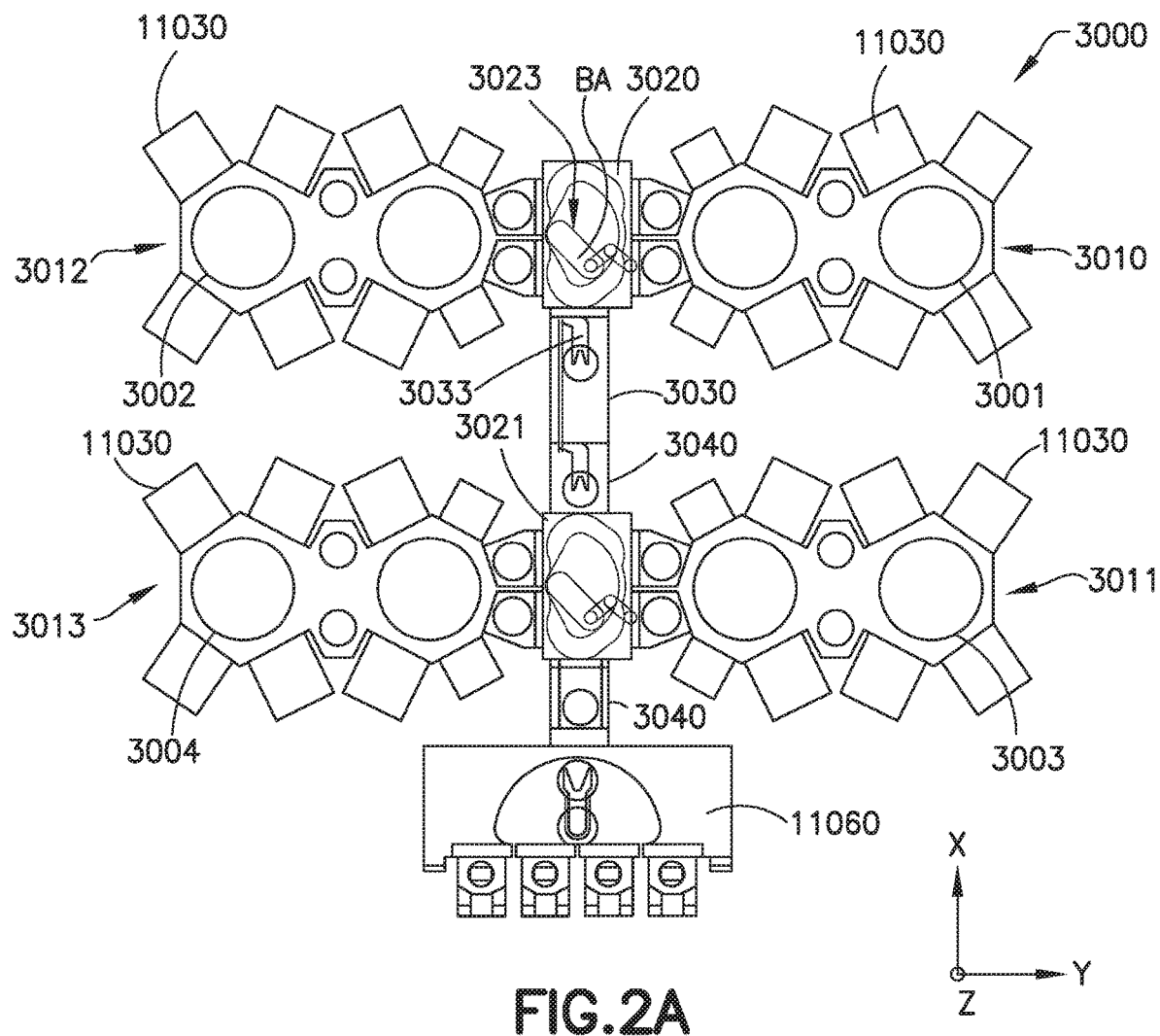
Figure 2B:
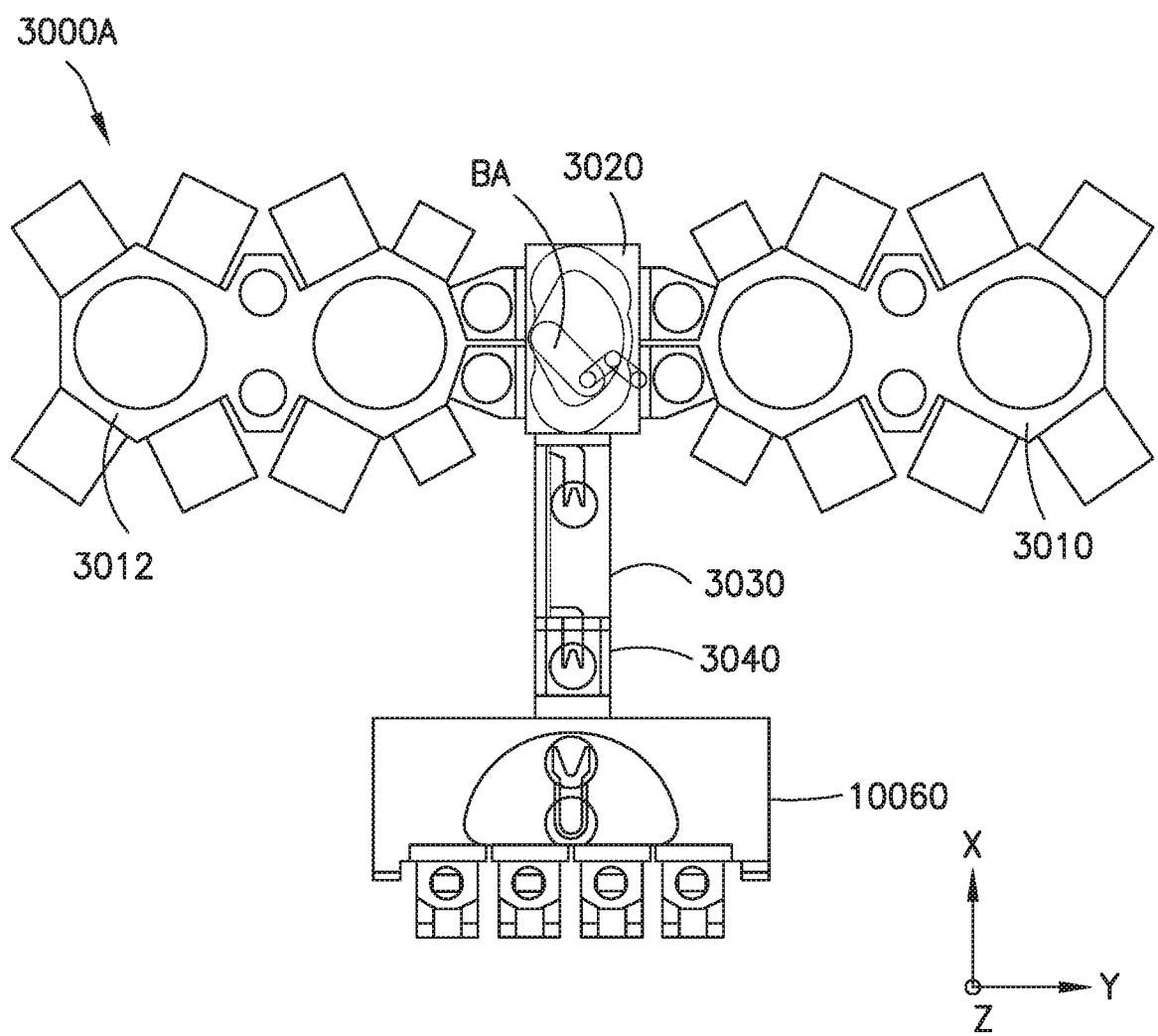
Figure 2C:
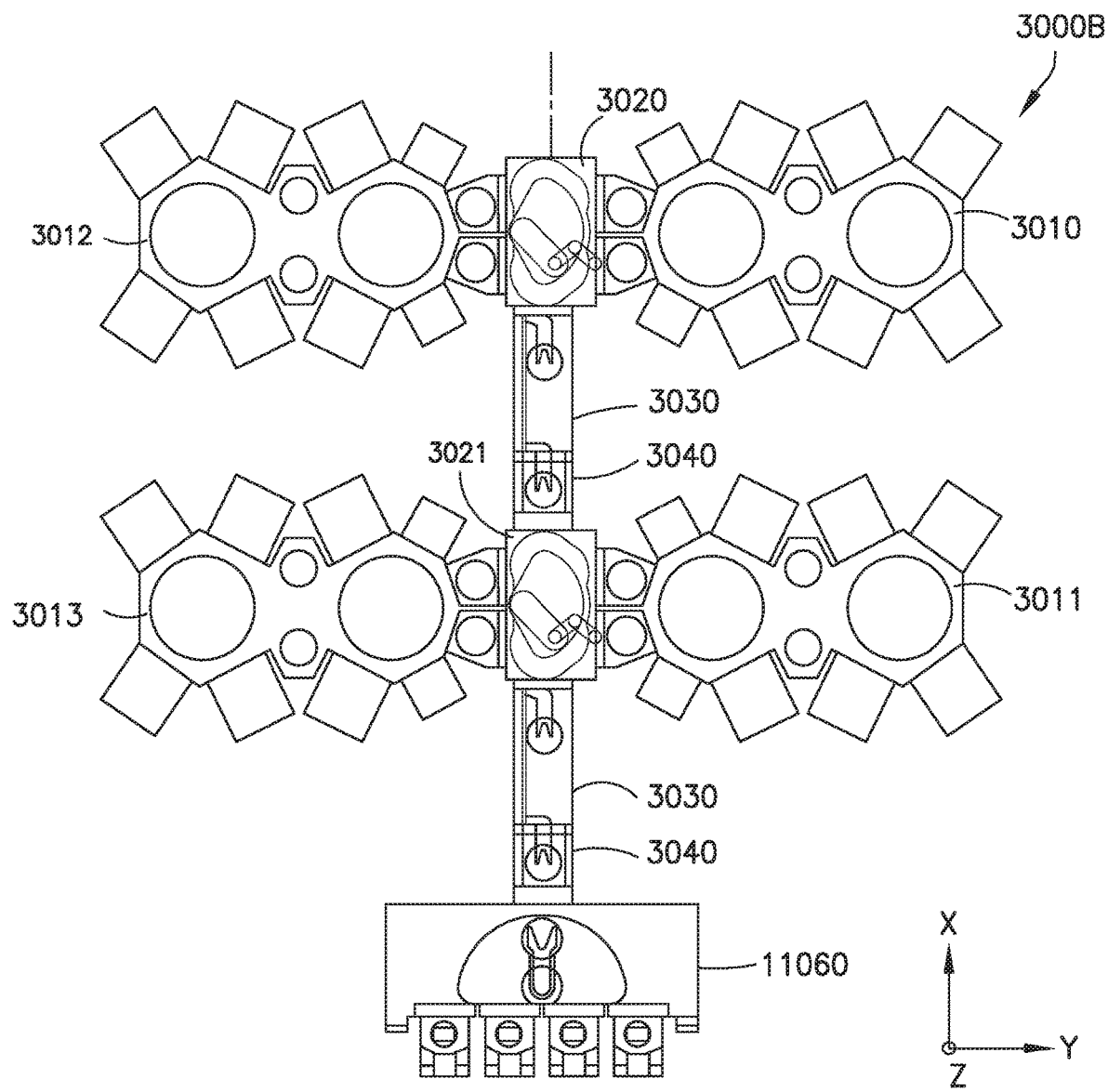
Figure 2D:
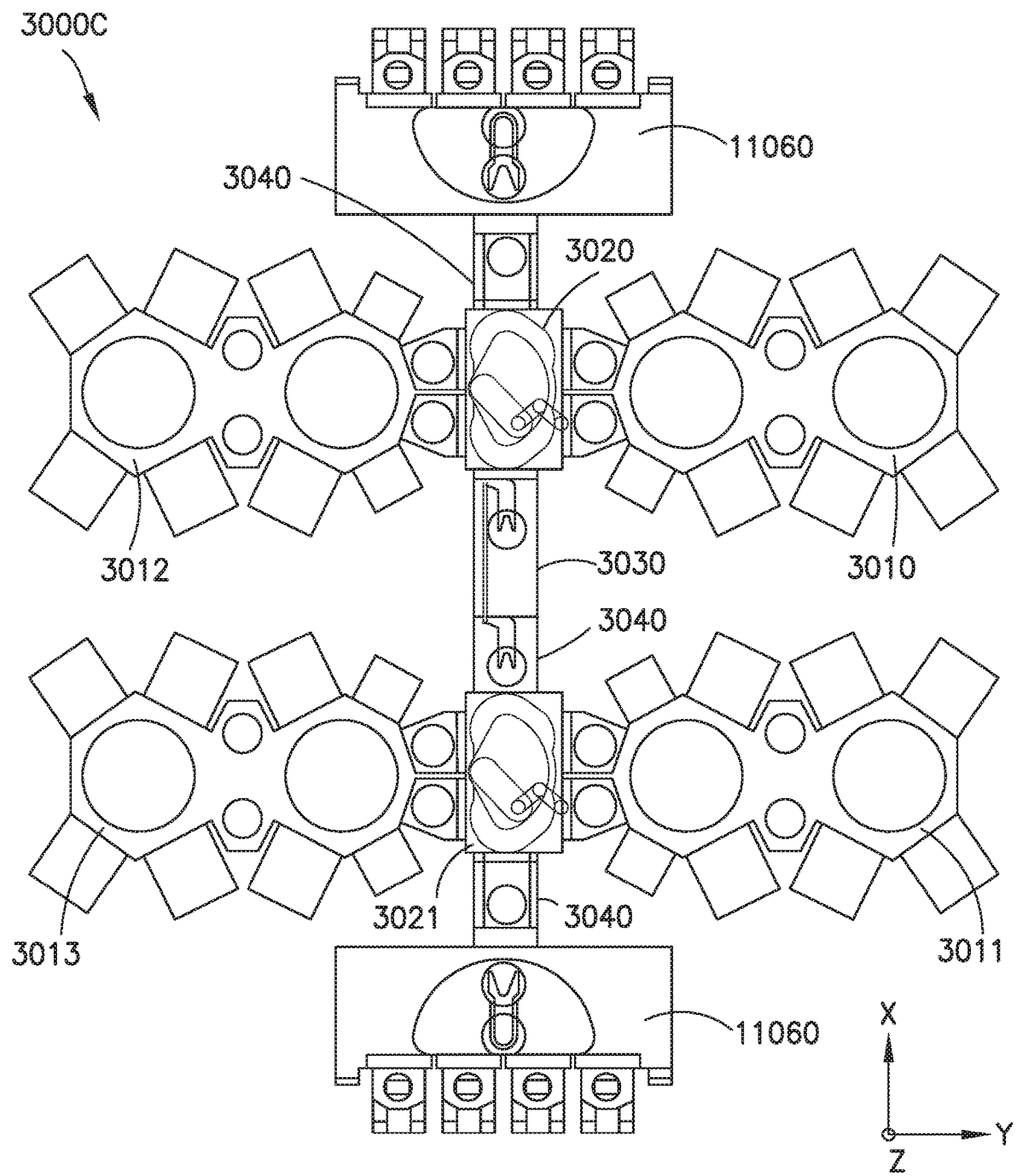
Figure 2G:
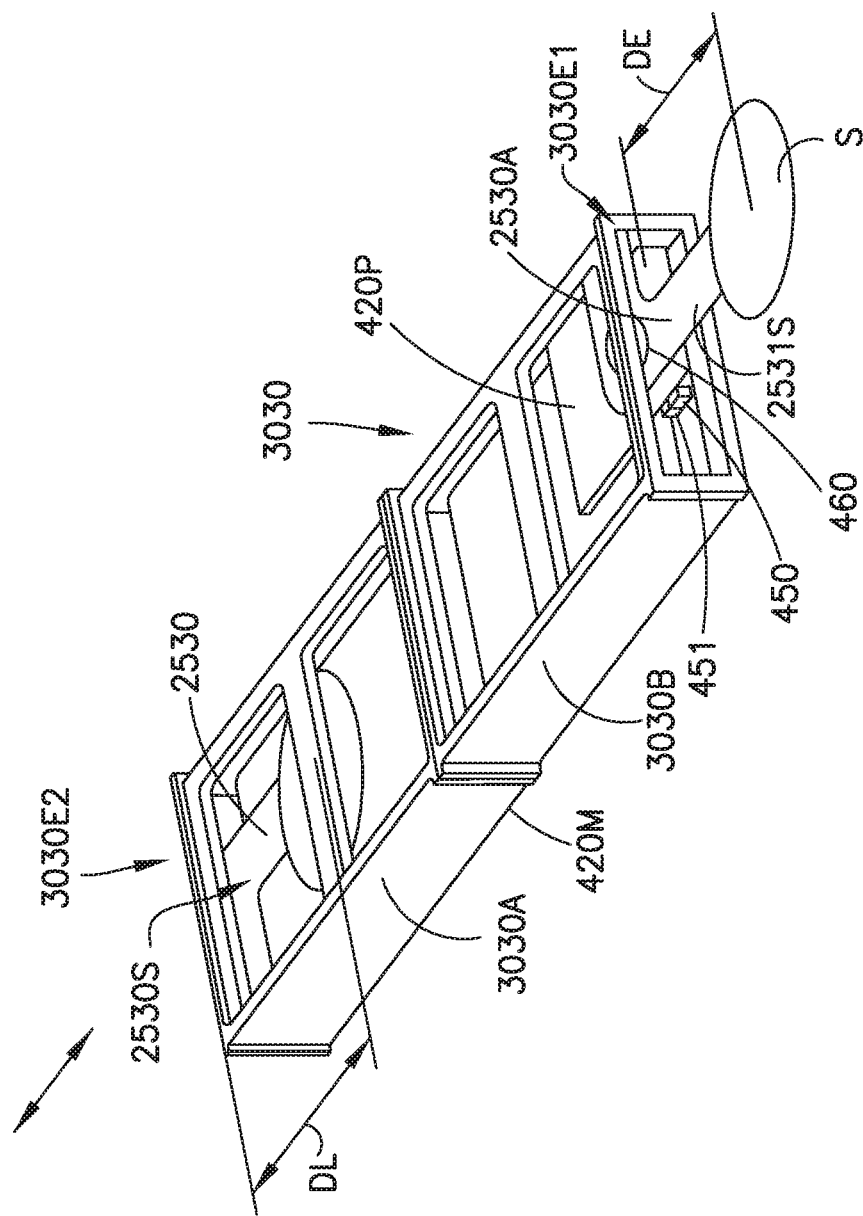
Figure 2H:
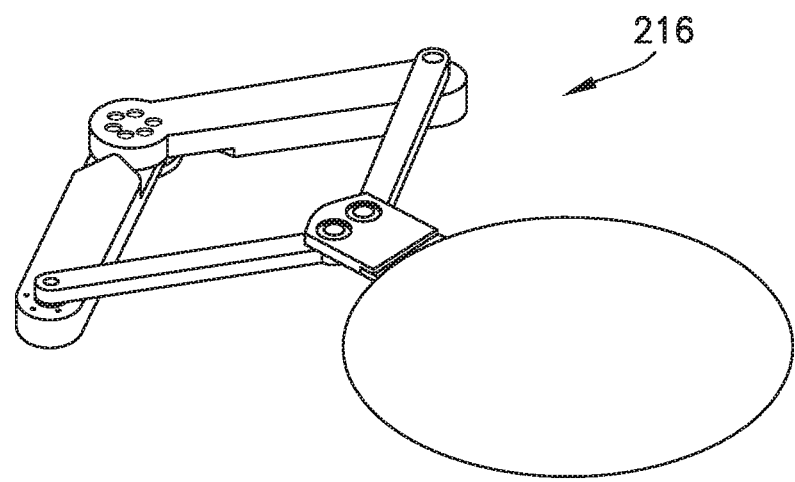
FIGS. 2H-2K are schematic illustrations of transport arms in accordance with aspects of the disclosed embodiment.
Figure 2I:
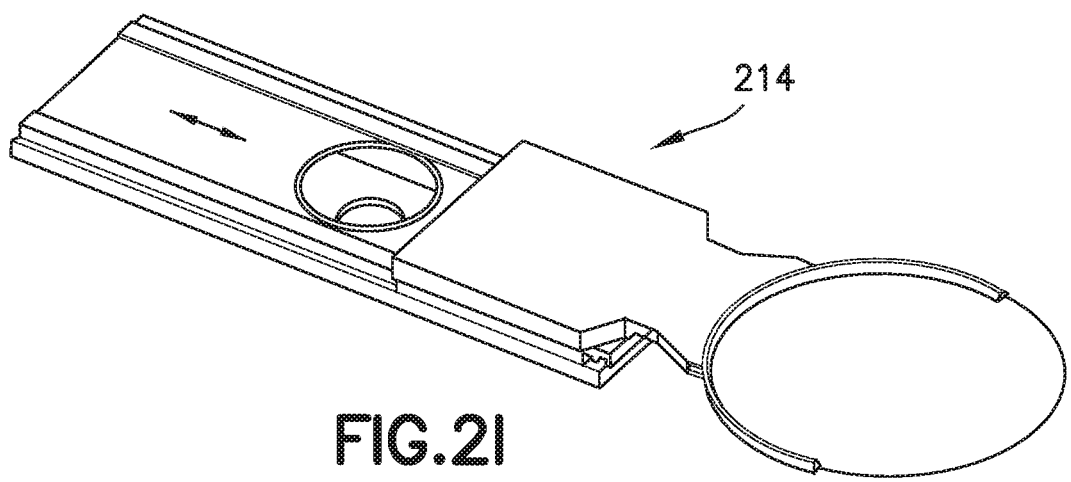
Figure 2J:
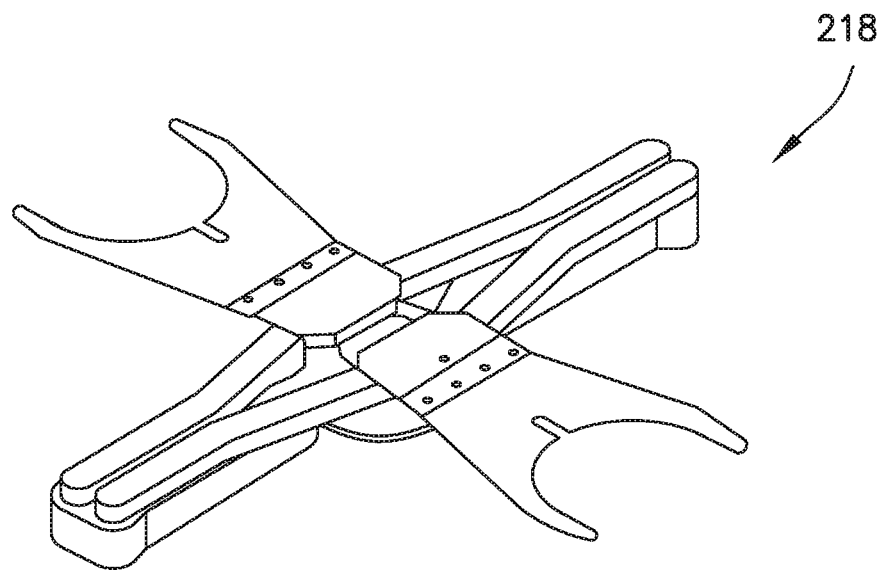
Figure 2K:
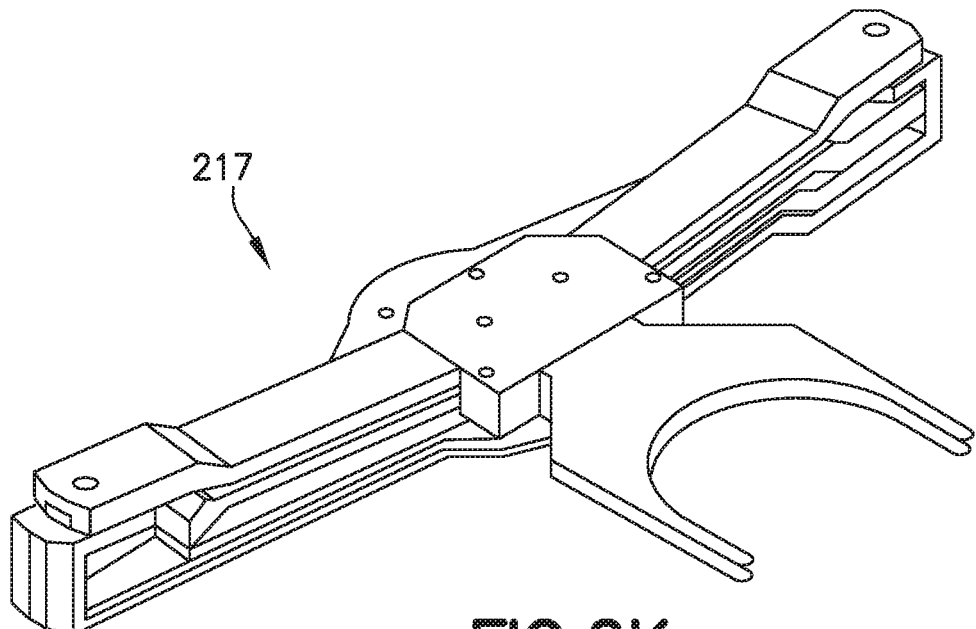

Referring also to FIG. 2G, a portion of a vacuum tunnel 3030 is shown having two vacuum tunnel modules 3030A, 3030B for exemplary purposes only. In one aspect end effectors 2530S, 2531S of the transport carts 2530, 2530A operating in the vacuum tunnel 3030 are configured to extend longitudinally within the vacuum tunnel 3030 so that each end effector 2530S, 2531S extends out of the tunnel by a predetermined distance DE for transferring the wafer S held on the end effector 2530S, 2531S to any suitable substrate holding station such as vacuum modules 3040 or handing off the wafers S substantially directly to a transport robot located within, for example, EFEM 11060 or transfer modules 3020, 3021. In other aspects the end effectors 2530S, 2531S have any suitable configuration or shape. In this aspect the end effectors 2530S, 2531S are facing in a common direction, e.g. towards longitudinal end 3030E1 of the vacuum tunnel 3030 and as such the end effectors 2530S, 2531S may only extend past the end 3030E1 for transferring substrates S. As may be realized, any automation, such as the transport robots described herein, located at longitudinal end 3030E2 of the vacuum tunnel 3030 are configured to extend into the vacuum tunnel 3030 by a predetermined amount DL for picking and placing wafers S substantially directly to the end effectors 2530S, 2531S. In other aspects the end effectors 2530S, 2531S face opposite directions so as to extend from both ends 3030E1, 3030E2 of the vacuum tunnel 3030. One or more of the transfer chambers 3020, 3021 and the linear transfer tunnels 3030 are connected to one or more EFEM 11060 (e.g. located at one or more ends of the processing tool) by a load lock 3040 that is substantially similar to, for example, load lock 11010 described above.

Figure 3:
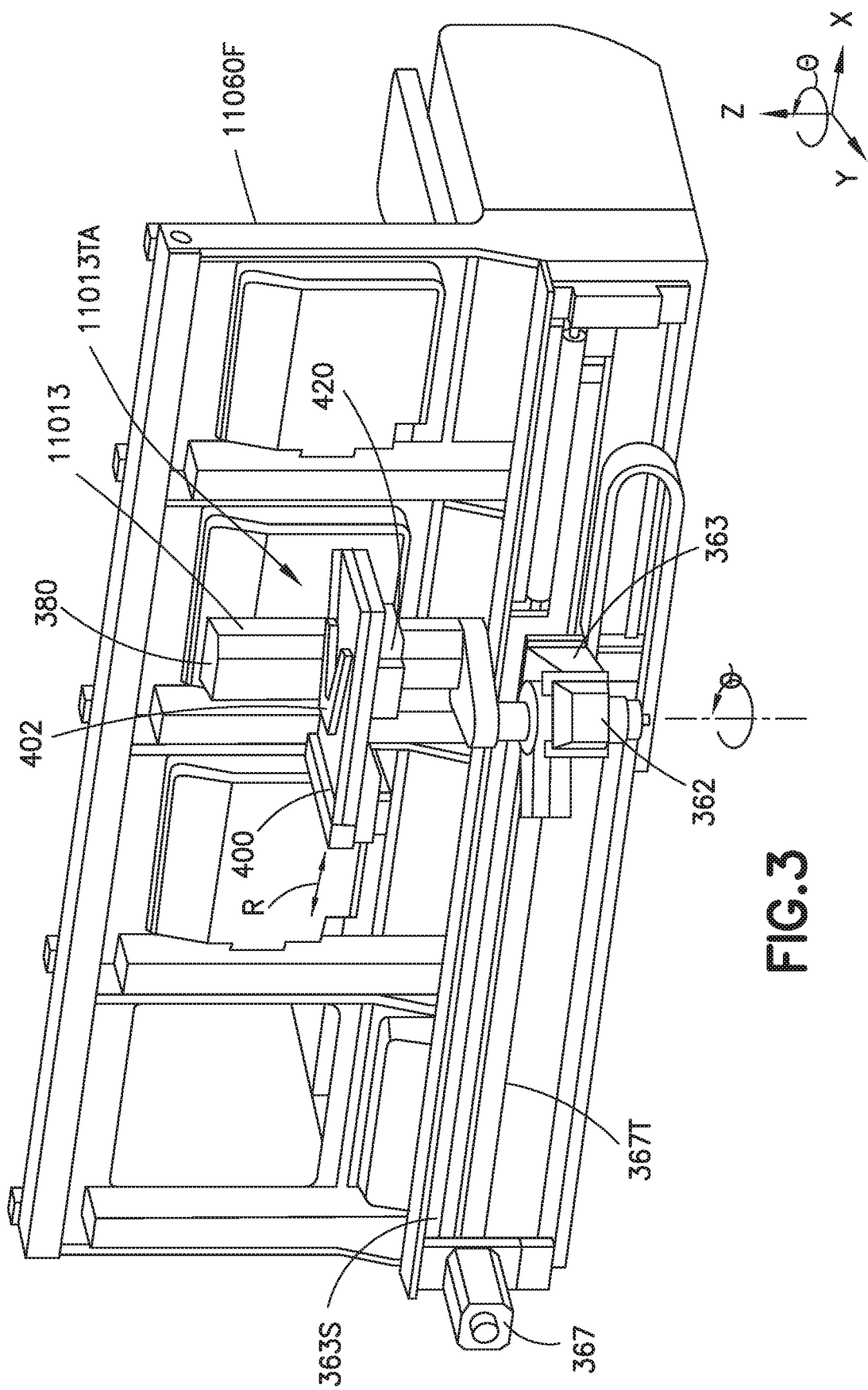
FIG. 3 is a schematic illustration of a portion of a processing apparatus incorporating aspects of the disclosed embodiment.

Referring now to FIG. 3 the aspects of the disclosed embodiment will be described with respect to an atmospheric transport robot 11013 but it should be understood that the aspects of the disclosed embodiment are equally applicable to vacuum transport robots 11014, 11014A, 11014B, 2080, 3023 and 2530 such as those illustrated in FIGS. 2A-2G. As may be realized, the transport robot 11013, 11014, 11014A, 11014B, 2080, 3023 and 2530 is mounted to a linear slide (as will be described in greater detail below) or a boom arm BA (FIG. 2B as described in U.S. patent application Ser. No. 14/377,987 previously incorporated herein by reference in its entirety) so as to be movable in at least the X and/or Y directions while in other aspects the transport robot 11013, 11014, 11014A, 11014B, 2080, 3023 and 2530 is mounted so that a base 362, 4001A, 4001B of the transport robot is fixed from movement in the X and/or Y directions. The configuration shown is representative for description purposes only and the arrangement, shapes and placement of the illustrated components may be varied as desired without deviating from the scope of the invention.

As can be seen in FIG. 3, in one aspect, the transport robot 11013 is movably mounted to a frame 11060F of the EFEM 11060 or in other aspects to a frame of any suitable module of the processing tool, such as a frame of the vacuum tunnel 3030 and/or transfer modules 3018, 3020, 3021. In this aspect, the transport robot 11013 includes any suitable number of drive axes to move a wafer along one or more of the X, Y, Z, θ and R (end effector extension) axes. For example, the transport robot 11013 includes a transport arm 11013TA that, in one aspect, is mounted to a carriage 363 so that the transport arm 11013TA is movably mounted to the frame 11060F. The carriage 363 is, in one aspect, mounted to a slide 363S so as to be movable in the X direction while in other aspects the carriage 363S is mounted to the frame 11060F so as to be fixed in the X (and/or Y direction). In one aspect any suitable drive 367 is mounted to the frame 11060F and drivingly connected to the carriage 363 by any suitable transmission 367T for moving the base in the X direction. In this aspect the transmission is a belt and pulley transmission and the drive is a rotary drive but in other aspects the drive is a linear actuator that is drivingly connected to the carriage 363 with any suitable transmission or without a transmission (e.g. such as where the carriage includes a drive portion of the linear actuator). Here the transport arm 11013TA includes a rotational drive 362, a Z-drive column 380, a slide body 420 and one or more end effectors. The rotational drive 362 is any suitable rotational drive mounted to the carriage 363 and a Z drive column 380 is mounted to an output of the rotational drive 362 so as to rotate in the direction of arrow T about the θ axis (e.g. the θ direction). A slide body 420 is movably mounted to the Z drive column 380 where the Z-drive column 380 includes any suitable drive motor and/or transmission for moving the slide body 420 in the Z direction. As may be realized, the relative position of the Z-drive column 380 with respect to the slide body 420 provides sufficient clearance for adequate traverse of the end effectors 420A, 420B and wafers to effect wafer detection by the one or more sensors 450, 451 as described further below.

Figure 4A:
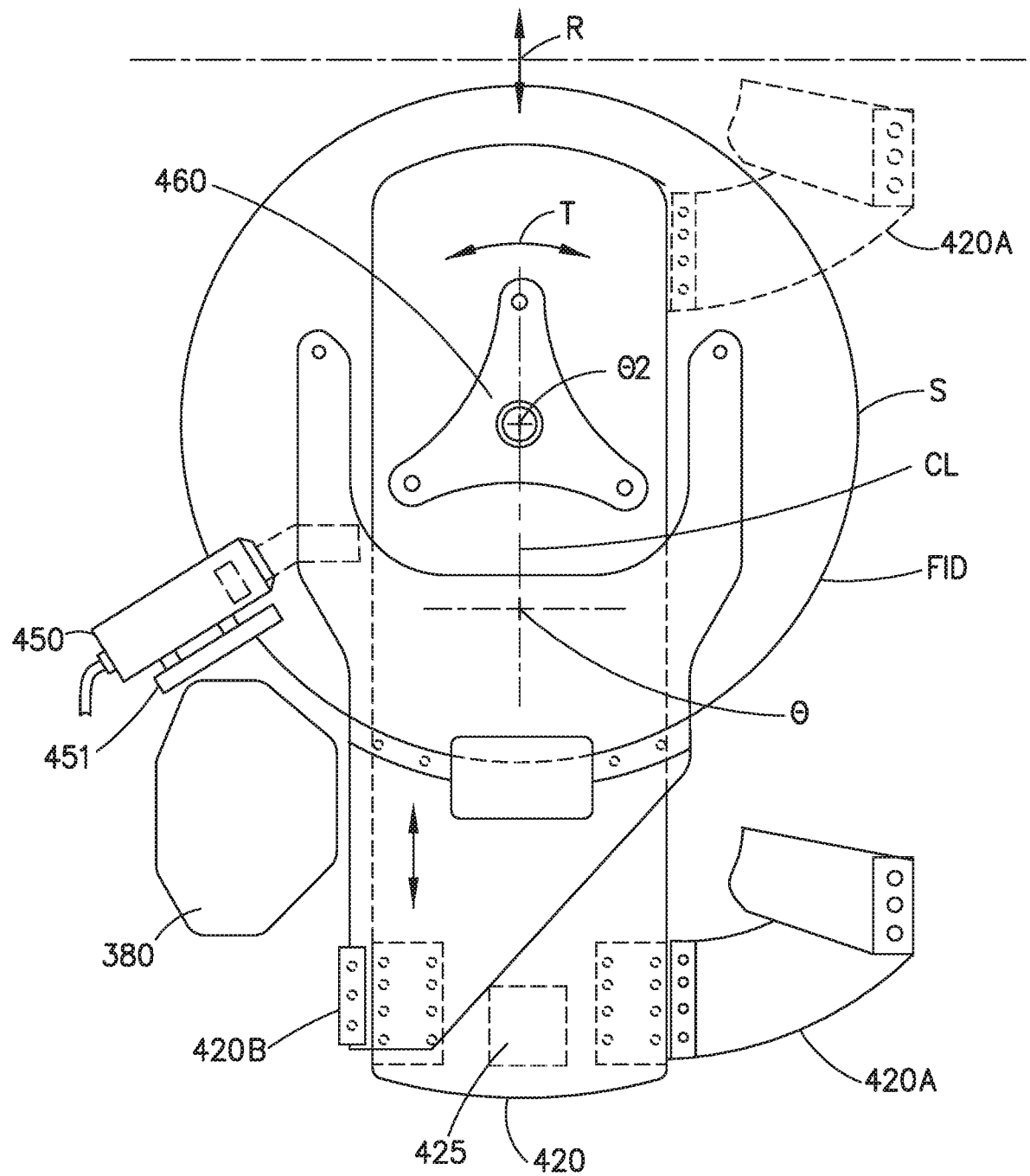
FIGS. 4A-4D are schematic illustrations of a portion of a transport apparatus incorporating aspects of the disclosed embodiment.
Figure 4B:
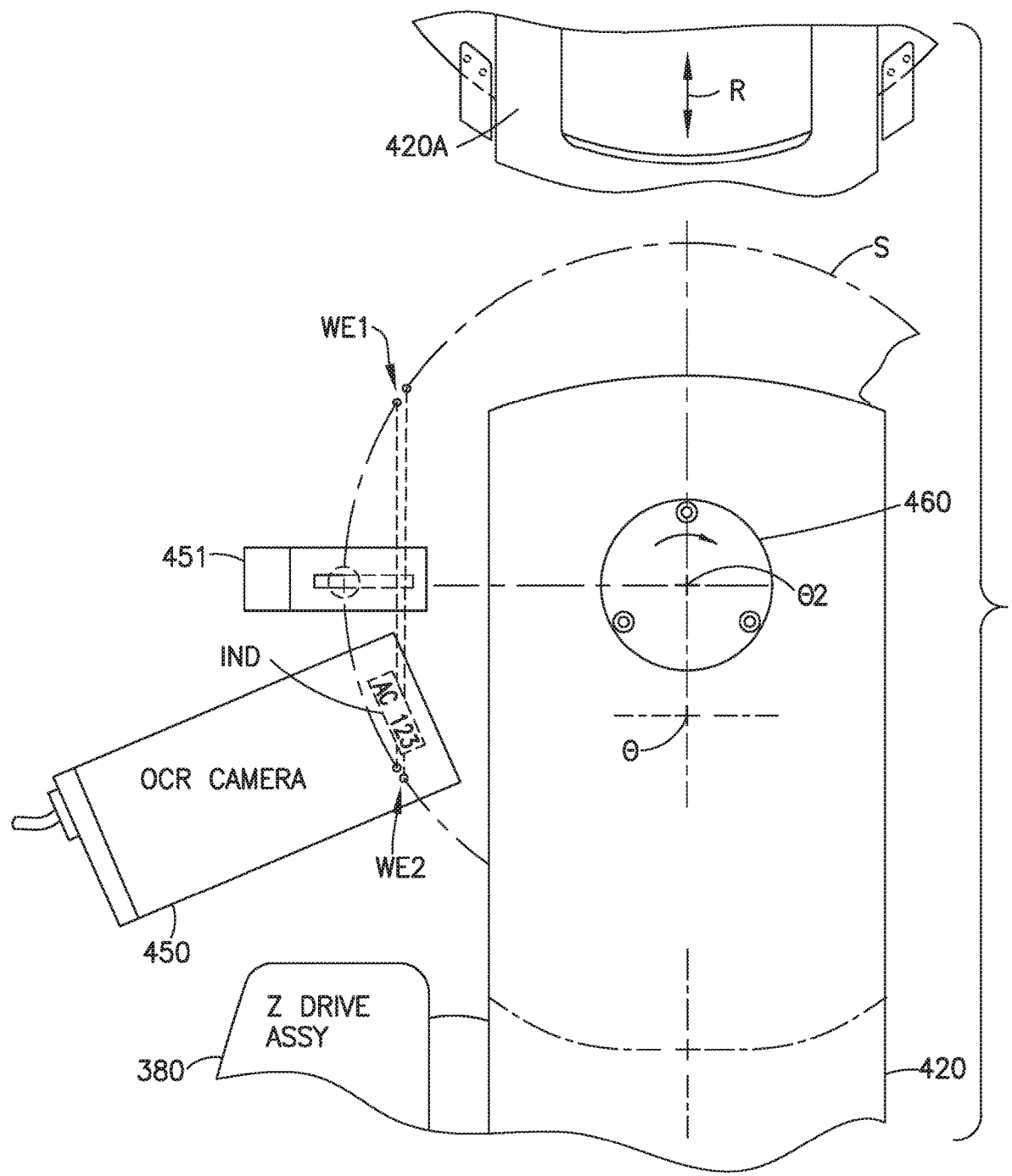
Figure 4C:
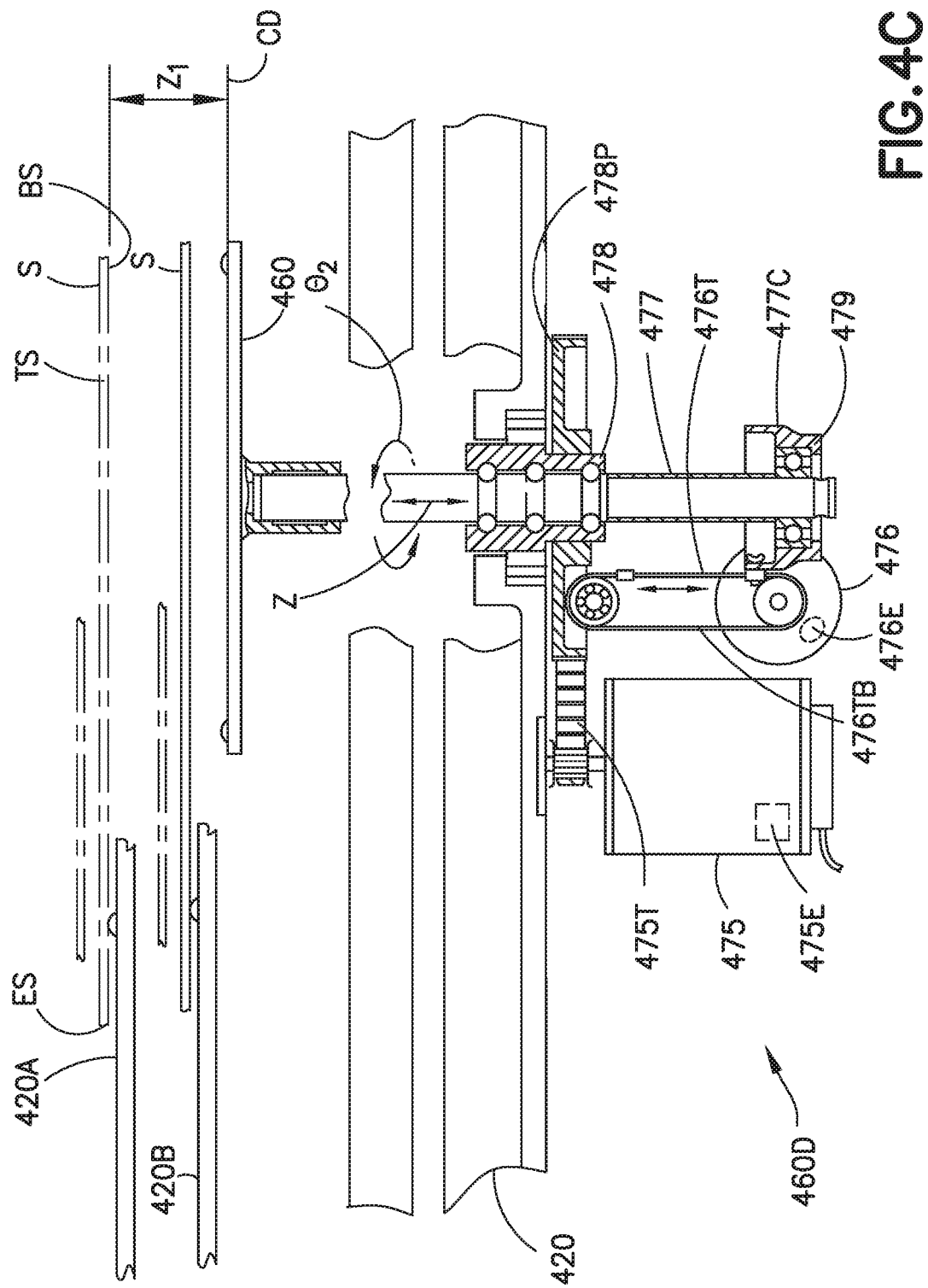

Referring also to FIGS. 4A-4C one or more (e.g. at least one) wafer holders or end effectors 420A, 420B are movably mounted to the slide body 420 in any suitable manner so as to extend and retract in the R direction. While two end effectors 420A, 420B are illustrated for exemplary purposes only it should be understood that any suitable number of end effectors are mounted to the slide body 420. For example, in one aspect there is a single end effector mounted to the slide 420 for effecting the transport and alignment of a wafer(s) in the manner described herein. In other aspects there are more than two end effectors mounted to the slide body 420 for effecting the transport and alignment of a wafer(s) in the manner described herein. As may be realized, the one or more end effectors traverse, with the transport arm 11013TA as a unit, in a first direction (e.g. one or more of the X, Y and Z directions) relative to the frame and traverses linearly relative to the transport arm 11013TA, in a second direction (e.g. the R direction) that is different from the first direction.

The slide body includes one or more linear drives 425 configured to independently move each end effector 420A, 420B in the R direction. The one or more linear drives 425 are any suitable drive(s) having any suitable transmissions which in one aspect are substantially similar to those described in, for example, U.S. provisional patent application No. 61/917,056 filed on Dec. 17, 2013 entitled "Substrate Transport Apparatus", the disclosure of which is incorporated by reference herein in its entirety. The end effectors 420A, 420B are arranged on the slide body 420 so that they are stacked one over the other so as to have a common axis R of extension and retraction.

Figure 4D:
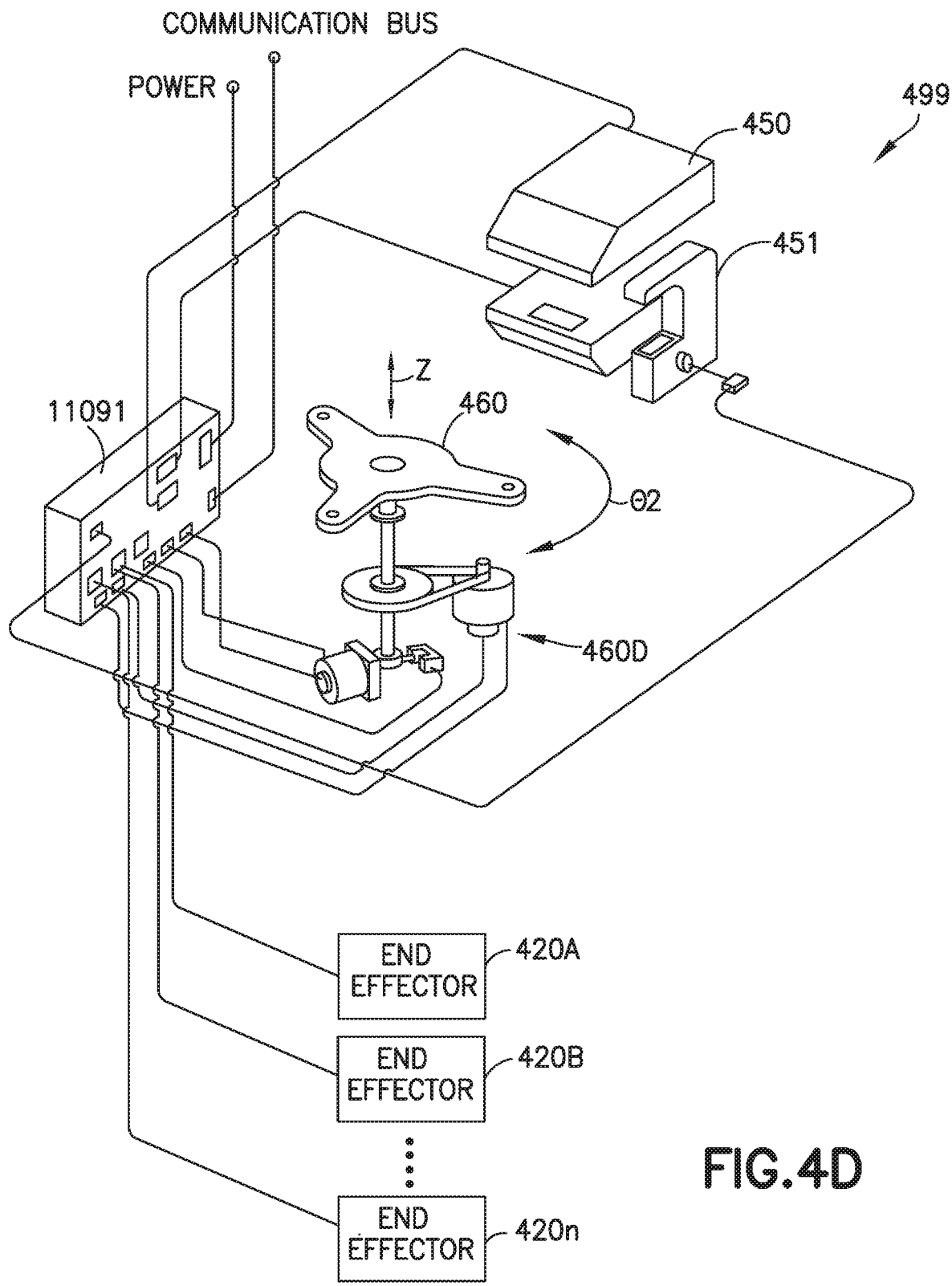

One or more sensors 450, 451 are mounted to the slide body 420 and are arranged to measure/detect an edge of the wafer to determine one or more predetermined characteristics of the wafer such as wafer diameter, wafer radial runout, a position of an alignment fiducial FID (e.g. notch/flat, mark or other feature) location, location of the wafer centerline, location of wafer center or any other suitable information pertaining to the wafer(s) carried by the end effectors 420A, 420B such as a wafer identification. As may be realized, the one or more sensors are mounted to the transport arm 11013TA so that the one or more sensors 450, 451 move with the transport arm 11013TA as a unit relative to the frame 11060F, where, as will be described below, the one or more sensors 450, 451 are a common sensor (e.g. common to each end effector and wafer carried thereon) effecting on-the-fly edge detection of each wafer of more than one wafers simultaneously supported by the one or more end effectors 420A, 420B. As will be described in greater detail below, the one or more sensors 450, 451 are configured so that the on-the-fly edge detection of each wafer is effected by and coincident with the traverse in the second direction of each end effector 420A, 420B of the more than one end effector 420A, 420B on the transport arm 11013TA. For example, the traverse of each end effector 420A, 420B in the second direction linearly transport a corresponding wafer, seated on the end effector 420A, 420B, of the more than one wafers simultaneously supported by the end effector(s) 420A, 420B, relative to the sensors 450, 451 effecting at least edge detection of the wafer. In one aspect the sensors include one or more optical sensors such as break-the-beam sensor or a line scan sensor/camera 451 configured to measure/detect wafer edge positions WE1, WE2 and/or the wafer fiducial as will be described in greater detail below. In one aspect the sensor 451 is configured to detect an edge WE1, WE2 (such as a leading and trailing edge) of the wafer and identify therefrom a wafer location and misalignment with respect to a predetermined reference frame, such as a reference frame of the transport robot and/or substrate station. As an example, where the sensor 451 is a break-the-beam sensor the sensor 451 detects points on the wafer edge. Where the sensor 451 is a line scan sensor/camera (such as a CCD array or any other suitable scanner) the sensor detects an arc of the wafer edge (e.g. effected through detection of multiple points defining the arc of the wafer edge, or a continuous or a substantially continuous scan of the wafer edge). In another aspect the sensors also include any suitable camera 450 configured to read, for example, wafer identification marking features such as, for example, alphanumeric identifiers, two dimensional codes or other suitable identifying indicia located on the wafer. Referring briefly to FIG. 4D the camera is, in one aspect, configured to scan one or more of a top surface TS (e.g. the side facing away from the end effector on which the wafer is located), a bottom surface BS (e.g. the side facing the end effector on which the wafer is located) and a peripheral edge ES of the wafer S.

Referring again to FIGS. 4A-4C, any suitable rotary chuck or spinner (e.g. such as the aligner noted above) 460 is connected to the slide body 420 so as to move as a unit with the slide body 420. The chuck 460 is disposed on the transport robot to cooperate with each end effector 420A, 420B and effect rotation of the corresponding wafer seated on the end effector 420A, 420B and one or more of finding and reading optical character recognition marks on the wafer, detecting a fiducial of the wafer, finding the center of the wafer and rotationally positioning the wafer in a predetermined orientation (such as to effect repositioning for wafer alignment). The chuck 460 is rotatably mounted to the slide body 420 so that a center of rotation θ2 of the chuck is substantially coincident with a centerline CL of the end effectors 420A, 420B while in other aspects the chuck 460 has any suitable spatial relationship with the end effectors that allows for a transfer of wafer(s) between each end effector 420A, 420B and the chuck 460. In one aspect, the chuck 460 is an active edge gripping chuck (the chuck includes movable grippers that grip the edge of the wafer), a passive gripping chuck (e.g. the wafer rests on passive support pads of the chuck) or a vacuum gripping chuck. In one aspect referring to FIGS. 4C and 4D the chuck 420 includes at least two degrees of freedom. For example, the chuck is rotatable about the axis θ2 and is linearly movable in the Z direction along the axis θ2. The chuck 460 includes a chuck drive 460D that includes a rotation drive 475 and a Z axis drive 476 that drive a drive shaft 477 in rotation and linear movement respectively. For example, drive 460D includes a rotating spline bearing 478 in which the drive shaft 477 is located. The drive shaft 477 includes splines that interface with splines of the rotating spline bearing 478 so that as the rotating spline bearing 478 rotates the drive shaft 477 rotates with it. A pulley 478P is fixed to the rotating spline bearing and is driven by the rotation drive 475 through transmission 475T. As may be realized, as the pulley 478P rotates the rotating spline bearing 478 rotates with it. The drive shaft 477 is supported in the Z direction within the rotating spline bearing 478 by, for example, a carriage 477C that is fixed to a belt 476TB of vertical drive transmission 476T so that as the belt moves in the Z direction the carriage 477C moves with it. The belt is driven by the Z axis drive 476 with pulleys or in any other suitable manner. The carriage 477C includes any suitable bearing for supporting 479 such as, for example, a thrust bearing, configured to support the drive shaft 477 within the carriage 477C. In other aspects the transmissions 476T, 475T and drives 475, 476 have any suitable configuration for moving the drive shaft, and the chuck mounted thereto, in the θ2 and Z axes. It should be understood that while the drive 460D is illustrated as being underneath the slide body 420 in other aspects at least a portion of the drive 460D is located to a side of the slide body 420.

Referring to FIG. 4D and as noted above the processing tool and its components, such as the transport robot 11013 (and the other transport robots described herein) are controlled by one or more controllers 11091 that are configured to at least cycle a linear traverse of each end effector 420A, 420B . . . 420n past the one or more sensors 450, 451 and effect at least edge detection of each corresponding wafer held by each end effector 420A, 420B . . . 420n in the manner described herein to effect wafer alignment. Here the transport robot alignment system 499 (which includes at least the end effector(s) 420A, 420B . . . 420n, the chuck 460 and its drive 460D and the one or more sensors 450, 451) is connected to, for example, controller 11091 or any other suitable controller configured to operate the transport robot alignment system 499 in the manner described herein.

Figure 5A:
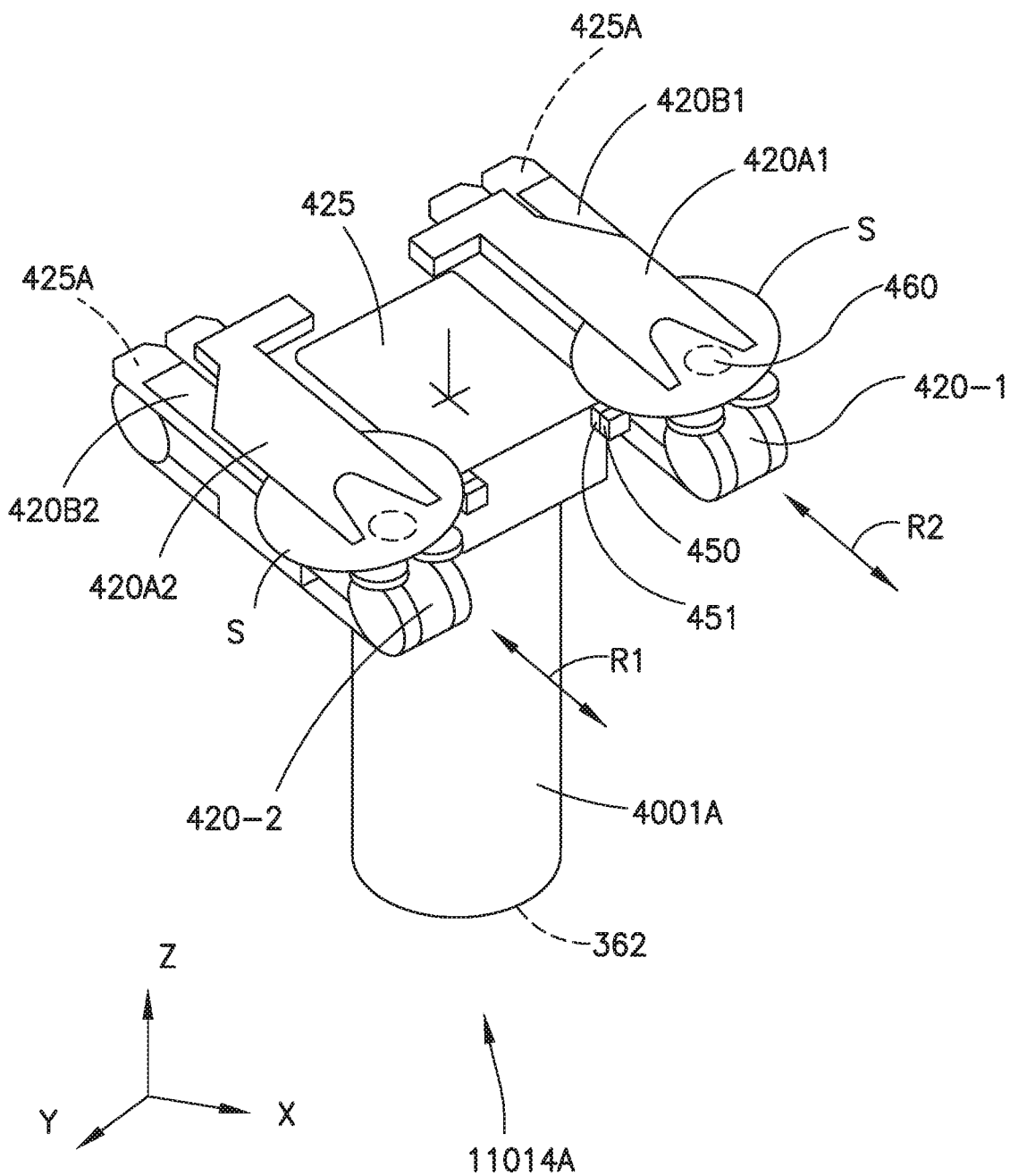
FIGS. 5A and 5B are schematic illustrations of a portion of a transport apparatus incorporating aspects of the disclosed embodiment.
Figure 5B:
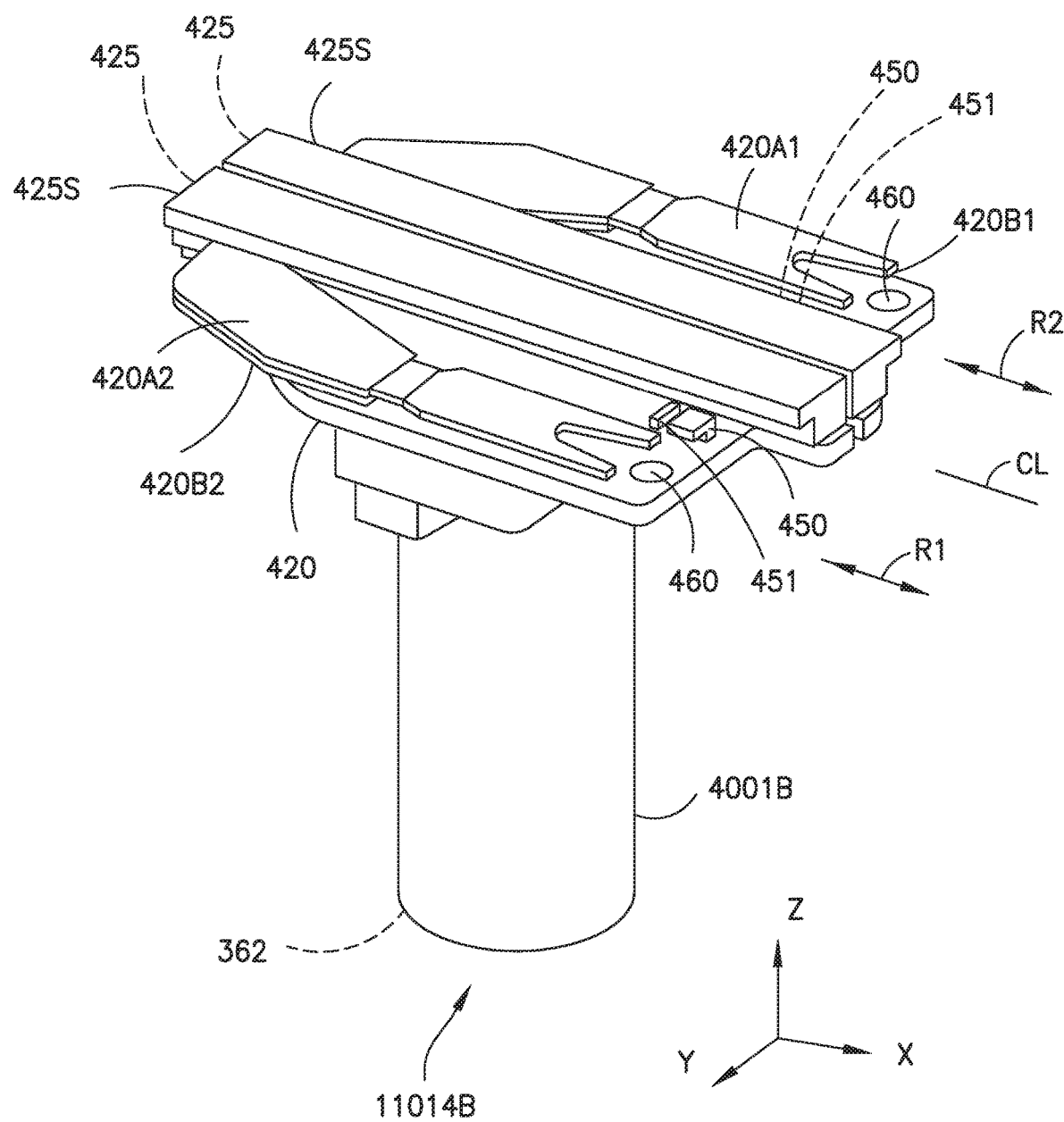

Referring again to FIGS. 1B, 1C, 2A and also to FIGS. 5A and 5B, as described above the aspects of the disclosed embodiment, in one aspect, are included with vacuum transport robots 11014, 11014A, 11014B, 2080, 3023. For example, transport arm 2080 includes a slide body 420 and end effectors 420A, 420B that are substantially similar to those described above however, in this aspect the transport robot 2080 is mounted so that the carriage/base 4001 is stationary or fixed in the X and/or Y directions. As may be realized, the transport robot 2080 includes any suitable seals and drives with respect to the slide body 420 and end effectors 420A, 420B (which in one aspect are substantially similar to those described in U.S. provisional patent application No. 61/917,056 previously incorporated by reference herein in its entirety) to allow operation of the transport robot 2080 in a vacuum environment. As described above, the slide body 420 includes the chuck 460 and the one or more sensors 450, 451.

Similarly, the transport robot 11014 in one aspect is a single extension axis R robot, similar to transport robot 2080 while in other aspects the transport robot 11014A, 11014B is a multiple extension axis R1, R2 robot configured to transport wafers to side-by-side substrate holding areas. In one aspect the transport robot 11014A, 11014B is substantially similar to those described in U.S. provisional patent application No. 61/917,056 previously incorporated by reference herein in its entirety. Here each extension axis R1, R2 includes one or more end effectors 420A1, 420B1, 420A2, 420B2 configured for extension along a respective axis R1, R2.

Referring to FIG. 5A, with respect to transport robot 11014A, the one or more end effectors 420A1, 420B1, 420A2, 420B2 are mounted to a respective slide body module 420-1, 420-2 in a manner substantially similar to that described above for movement along a respective extension axis R1, R2. The slide body modules 420-1, 420-2 are mounted to a drive module 425A which includes any suitable drives configured for the individual extension/retraction of each of the one or more end effectors 420A1, 420B1, 420A2, 420B2. The drive module 425A is mounted to a base 4001A substantially similar to base 4001 described above. Each slide body module 420-1, 420-2 includes the chuck 460 and the one or more sensors 450, 451 in a manner substantially similar to that described above.

Figure 6A:
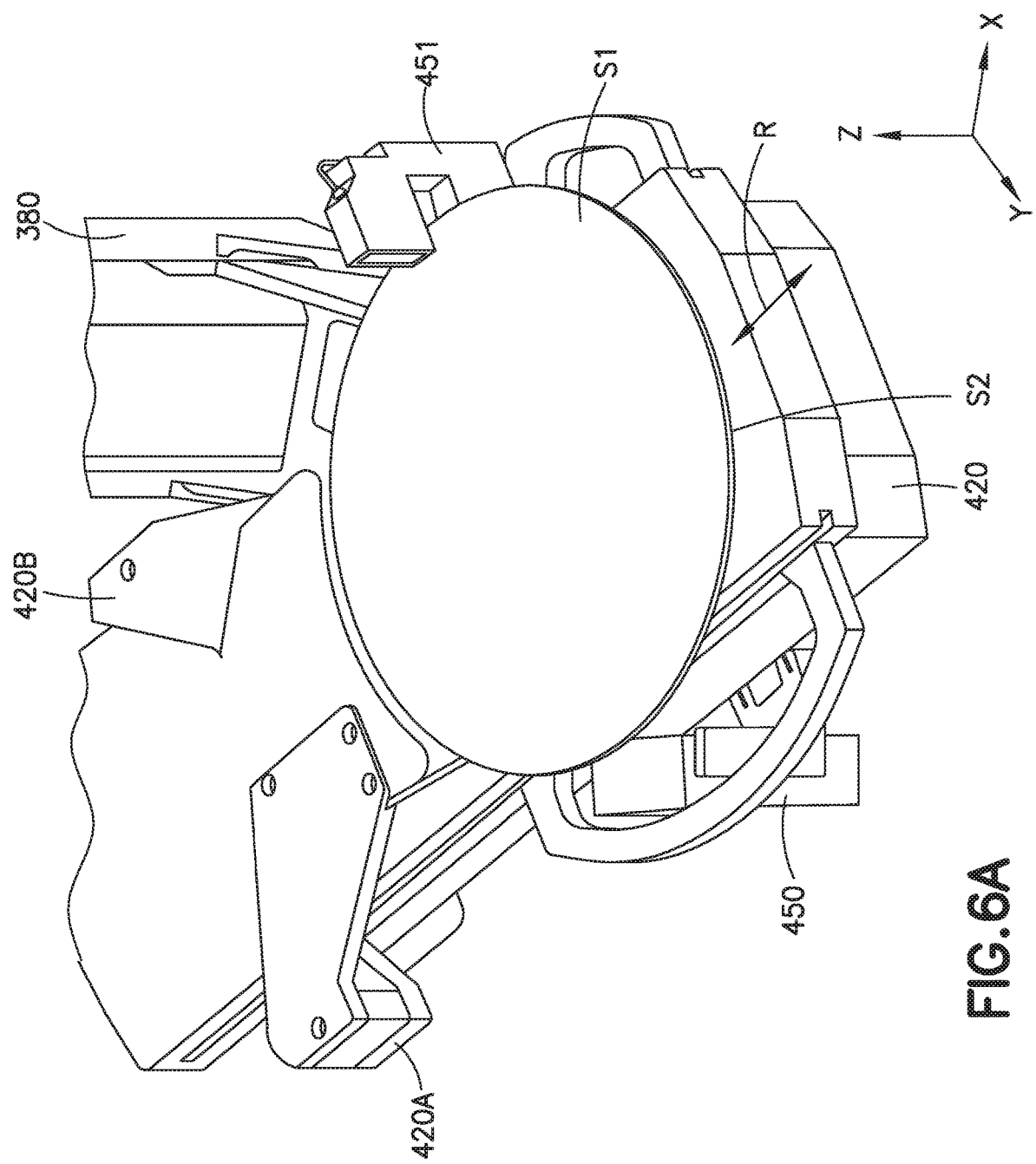
FIGS. 6A-6B are schematic illustrations of a portion of a transport apparatus incorporating aspects of the disclosed embodiment.

Referring to FIG. 5B each of the end effectors 420A1, 420B1, 420A2, 420B2 extend and depend from respective slides 425S disposed towards a centerline CL of the slide body 420 (rather than extend from the lateral sides of the slide body as shown in FIGS. 4A and 6) so that the slides 425S are disposed between end effector(s) 420A1, 420B1 and end effector(s) 420A2, 420B2. Each of the slides 425S include any suitable drive 425 for effecting the individual extension/retraction of each of the one or more end effectors 420A1, 420B1, 420A2, 420B2. The slide body 420 is mounted to a base 4001B substantially similar to base 4001 described above and includes, a chuck 460 and one or more sensors 450, 451 that are common to end effector(s) 420A1, 420B1 and a chuck 460 and one or more sensors 450, 451 that are common to end effector(s) 420A2, 420B2.

Referring also to FIG. 2G, the transport system of the vacuum tunnel 3030 includes aspects of the disclosed embodiment where the one or more vacuum tunnel modules 3030A-3030n form a portion of a slide body 420M from which the end effectors 2530S, 2531S depend and travel along. The slide body 420M includes a platform 420P that includes the chuck 460 and the one or more sensors 450, 451. The platform 420P is positioned within the slide body and relative to each end effector 2530S, 2531S so that wafers are transferred between the chuck 460 and each end effector 2530S, 2531S and so that as the end effectors 2530S, 2531S pass over the platform 420P the one or more sensors 450, 451 read/detect features of the wafer as described herein to effect on-the-fly wafer alignment as also described herein.

Figure 6B:
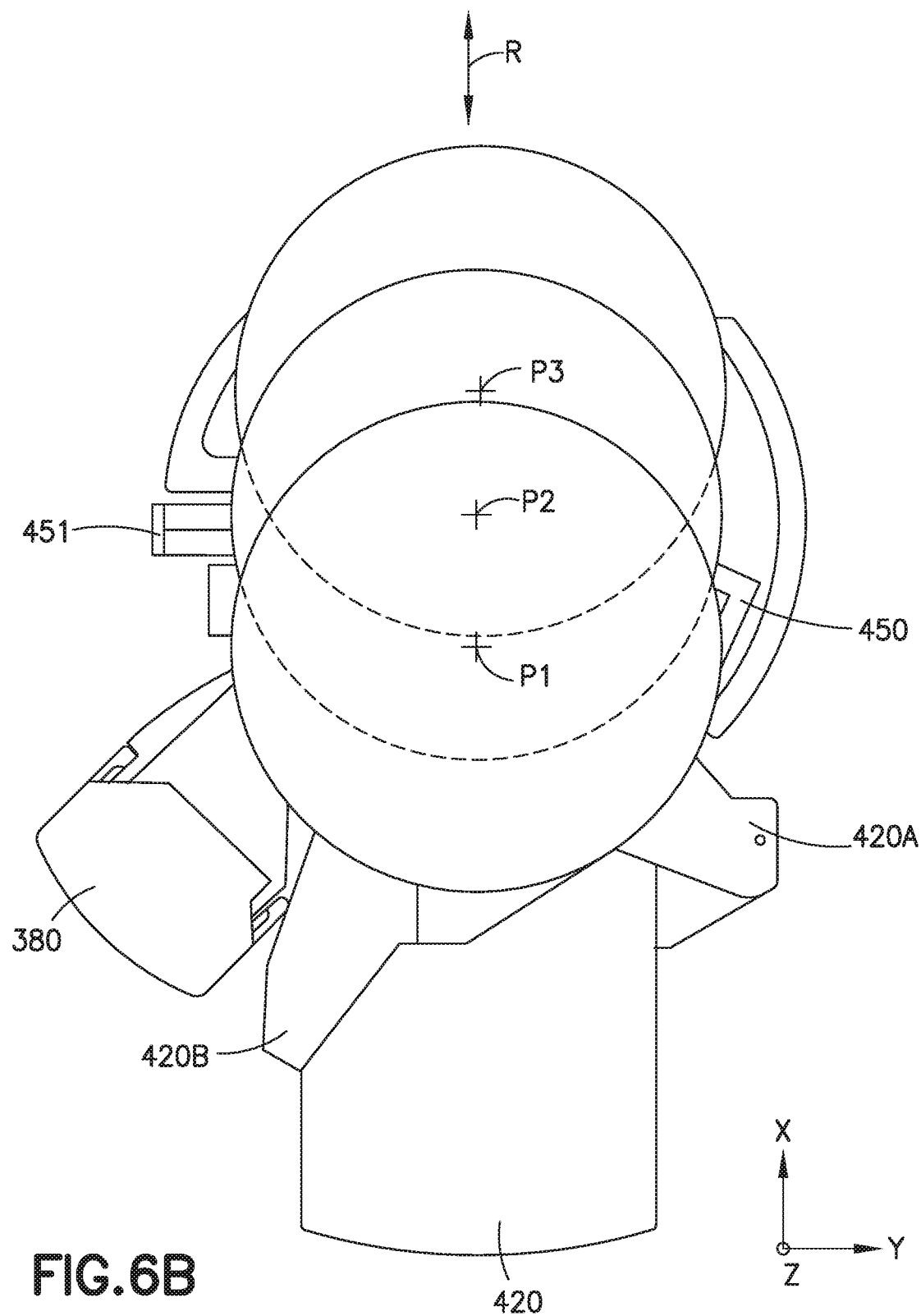
Figure 7A:
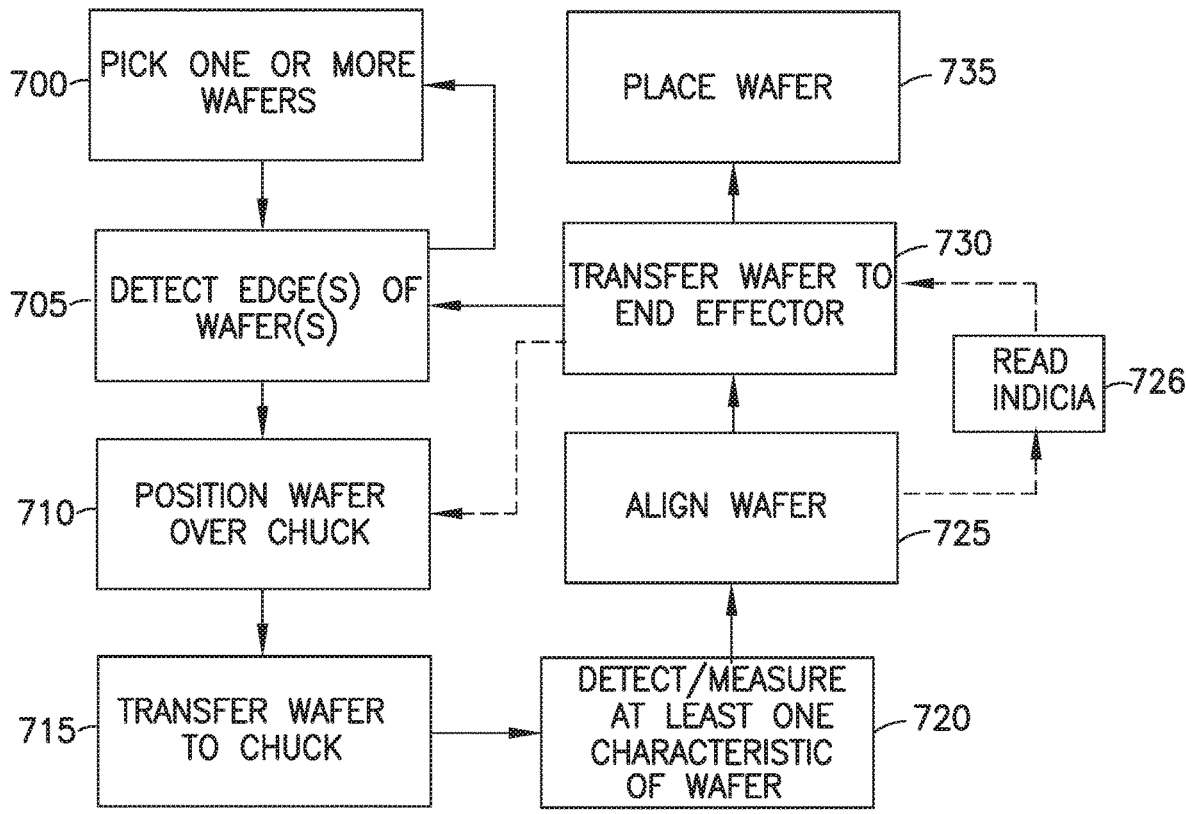
FIGS. 7A and 7B are flow diagrams in accordance with aspects of the disclosed embodiment.

Referring now to FIGS. 4A-4C, 6A and 6B an exemplary operation of the aspects of the disclosed embodiment will be described. As may be realized, the one or more end effectors 420A, 420B . . . 420n operate to pick and place wafers S to and from any suitable substrate holding containers (e.g. such as front opening unified pods/FOUPS, closed/open cassettes or shipping containers/FOSBYS, etc.) and/or any suitable substrate holding station (e.g. process modules, metrology/measurement stations, etc.). In one aspect one or more wafers S are picked by respective ones of the one or more end effectors 420A, 420B . . . 420n of, for example, transport robot 11013 (FIG. 7A, Block 700). It is noted that transport robot 11013 is used in this example for exemplary purposes only and in other aspects any of the atmospheric and/or vacuum transport robots described herein are operated in a manner substantially similar to that described herein with respect to transport robot 11013. During a pick, an end effector 420A, 420B . . . 420n is extended (e.g. linearly traversed) in the R direction to a wafer holding location and the wafer is lifted from the wafer holding location. The end effector 420A, 420B . . . 420n, with the corresponding wafer thereon, is retracted (e.g. linearly traversed) in the R direction to remove the wafer from the wafer holding location. As the wafer S is retracted on the end effector 420A, 420B . . . 420n, from for example, position P3 to the retracted position P1 the wafer S passes the one or more sensors 451, 450 and at least one edge WE1, WE2 (e.g. leading and or trailing edges relative to a path of wafer travel along the R direction) of the wafer S is detected (FIG. 7A, Block 705). In one aspect one or more different wafers W are picked by other end effectors 420A, 420B . . . 420n so that the one or more end effectors 420A, 420B . . . 420n of the transport robot 11013 are each holding a corresponding wafer S (e.g. more than one wafers are simultaneously being held by the one or more end effectors 420A, 420B . . . 420n) (FIG. 7A, Block 700). As each wafer is retracted by the end effector, each wafer passes the one or more sensors 150, 151 to detect a corresponding at least one edge WE1, WE2 (FIG. 7A, Block 705). As described above, the relative position of the Z-drive column 380 (as shown in FIG. 6B) with respect to the slide body 420 provides sufficient clearance for adequate traverse of the end effectors 420A, 420B and wafers to effect wafer detection by the one or more sensors 450, 451. For exemplary purposes, in one aspect the Z-drive column 380 is orientated at an angle of about 45° relative to the axis of extension and retraction R of the end effectors while in other aspects the Z-drive column 380 is located at any suitable angle relative to the axis of extension and retraction R of the end effectors. As may be realized, the controller 11091 includes any suitable memory for storing data corresponding to each wafer held on a respective end effector. For example, as end effector 420A retracts edge(s) WE1, WE2 the wafer W held on the end effector 420A are detected and that positional data is stored in the controller memory, as end effector 420B retracts edge(s) WE1, WE2 the wafer W held on the end effector 420B are detected and that positional data is stored in the controller memory, and so on.

As the one or more wafers W are being transported by the transport robot 11013, the one or more wafers W are selectively aligned. For example, the controller 11091 partially extends a corresponding end effector 420A, 420B . . . 420n so that a wafer is selectively positioned at position P2 over the chuck 460 (FIG. 7A, Block 710). In one aspect the controller 11091 extends the corresponding end effector 420A, 420B . . . 420n to position the wafer over the chuck 460 using the stored positional data obtained when the corresponding end effector 420A, 420B . . . 420n was retracted as noted above. In other aspects, the one or more sensors 450, 451 are actively employed during the partial extension of the corresponding end effector 420A, 420B . . . 420n to detect a perimeter edge of the wafer W while the wafer is being translated in the R direction to effect positioning the wafer W relative to the chuck 460. The chuck 460 is translated in the Z direction (FIG. 4C) to lift the wafer, positioned above the chuck 460, from the corresponding end effector 420A, 420B . . . 420n (FIG. 7A, Block 715). The chuck 460 is rotated, with the wafer thereon (e.g. the wafer rotates with the chuck) to detect and/or measure at least one predetermined characteristic (such as those described above) of the wafer W (FIG. 7A, Block 720). As may be realized, the chuck 460 is positioned on the slide body 420 relative to the one or more sensors 450, 451 so that when the wafer W is placed on the chuck 460 the wafer is within an optical viewing zone of the one or more sensors 450, 451. As may also be realized, the one or more sensors 450, 451 are common to both edge detection as the wafer is picked and the end effector is retracted and the detection/measurement of the at least one predetermined characteristic. As an example, in one aspect, the chuck 460 rotates the wafer W to detect, with the sensor 451, an amount of physical runout/eccentricity and a location of the wafer fiducial FID. Based on the amount of runout/eccentricity the wafer W is rotated by the chuck 460 so that a wafer indicia IND (FIG. 4B) is read by the sensor 450 and to align the fiducial FID at a predetermined orientation (FIG. 7A, Block 725). In addition, in one aspect, any suitable indicia IND on the wafer S is read by the one or more sensors 450, 451 with the wafer S on the chuck 460 (FIG. 7A, Block 726). In one aspect the aligned wafer W is transferred back to the corresponding end effector 420A, 420B . . . 420n from which it was removed through a lowering of the chuck 460 in the Z direction while in other aspects the aligned wafer W is transferred to a different end effector than the end effector from which it was removed (e.g. a swapping of the wafer from one end effector to another end effector) (FIG. 7A, Block 730). As may be realized, this swap serves to enable or decouple the initial end effector from the initial wafer so that it may commence a further action (e.g. transport and/or pick another wafer) without pause to relieve the initial wafer.

This alignment process (e.g. Blocks 705-730 or Blocks 710-730 of FIG. 7A) is selectively repeated for each wafer W held by the end effectors 420A, 420B . . . 420n so that the linear traversal of each end effector 420A, 420B . . . 420n is sequentially cycled in the R direction so that more than one wafers held by the end effectors 420A, 420B . . . 420n are each sequentially shuffled and scanned by a common edge detection sensor 451 and/or a common OCR sensor 450 during the sequential cycling of the linear traversal of each end effector 420A, 420B . . . 420n. As may be realized, scanning by the common edge detection sensor 151 during the sequential shuffle effects on-the-fly edge detection of each wafer W of the more than one wafers simultaneously supported by the at least one end effector 420A, 420B . . . 420n where the common edge detection sensor 151 is mounted to the transport arm so that the common edge detection sensor 151 moves with the transport arm as a unit relative to, for example, the frame 11060F of the EFEM 11060. In one aspect, the at least one end effector 420A, 420B . . . 420n is independently driven so that the more than one wafers W simultaneously held by the at least one end effector 420A, 420B . . . 420n are sequentially shuffled for detecting an edge(s) of each of the more than one wafers before engaging a first one of the wafers W with the chuck 460.

Figure 7B:
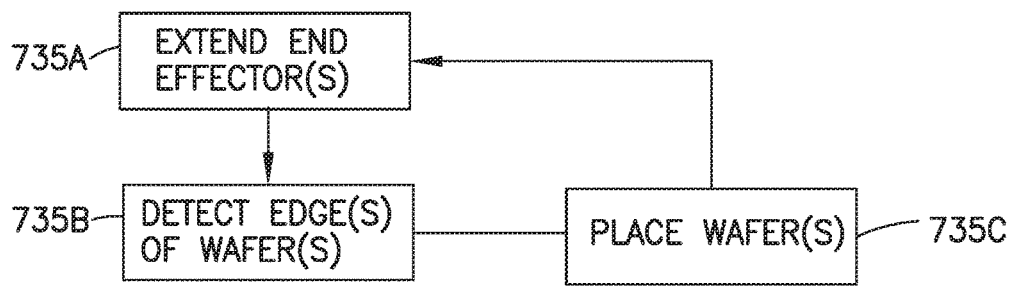

The aligned wafers W are placed by the corresponding end effector 420A, 420B . . . 420n at any suitable wafer holding location (FIG. 7A, Block 735). As may be realized, in one aspect, the edges WE1, WE2 of each wafer S are scanned, in a manner substantially similar to that described above, during extension of a corresponding end effector when being placed. For example, a corresponding end effector 420A, 420B . . . 420n, with the corresponding wafer thereon, is extended (e.g. linearly traversed) in the R direction to place the wafer to the wafer holding location (FIG. 7B, Block 735A). As the wafer S is extended on the end effector 420A, 420B . . . 420n, from for example, the retracted position P1 to the partially extended position P3 the wafer S passes the one or more sensors 451, 450 and at least one edge WE1, WE2 (e.g. leading and or trailing edges relative to a path of wafer travel along the R direction) of the wafer S is detected to, for example, verify a location of the wafer S relative to, for example, the end effector on which it is located (FIG. 7B, Block 735B). Depending on the position(s) of the detected edge(s) the transport robot accounts for any displacement of the wafer (relative to the end effector) that is detected by the sensor 450, 451 upon extension when placing the wafer S at a predetermined wafer holding location (FIG. 7B. Block 735C). As may be realized, as each wafer S is extended by the corresponding end effector, each wafer passes the one or more sensors 150, 151 to detect a corresponding at least one edge WE1, WE2 to verify a location of the wafer (relative to the end effector) for placement at a wafer holding station. As may also be realized, in one aspect, the wafers W are scanned (FIG. 7B) for placement sequentially before a first one of the wafers is placed at the wafer holding location (e.g. the wafer W are shuffled on the transport robot to verify a location of each wafer before any of the wafers are placed at the substrate holding location).

As may be realized, in one aspect, any suitable wafer slip detection is employed on one or more of the end effectors 420A, 420B . . . 420n and/or on the chuck 460. The wafer slip detection is effected through, for example, the one or more sensors 450, 451 and determines whether the wafer is in a position of certainty with respect to the end effector 420A, 420B . . . 420n and/or the chuck and whether the wafer is vulnerable to inaccurate centering or alignment. As may be realized, inaccurate centering or alignment may result in wafer breakage and/or incorrect positioning. If it is determined that the wafer position is uncertain the controller 11091 may effect any suitable visual and/or aural indication to an operator for correction of the wafer position.

Figure 8A:
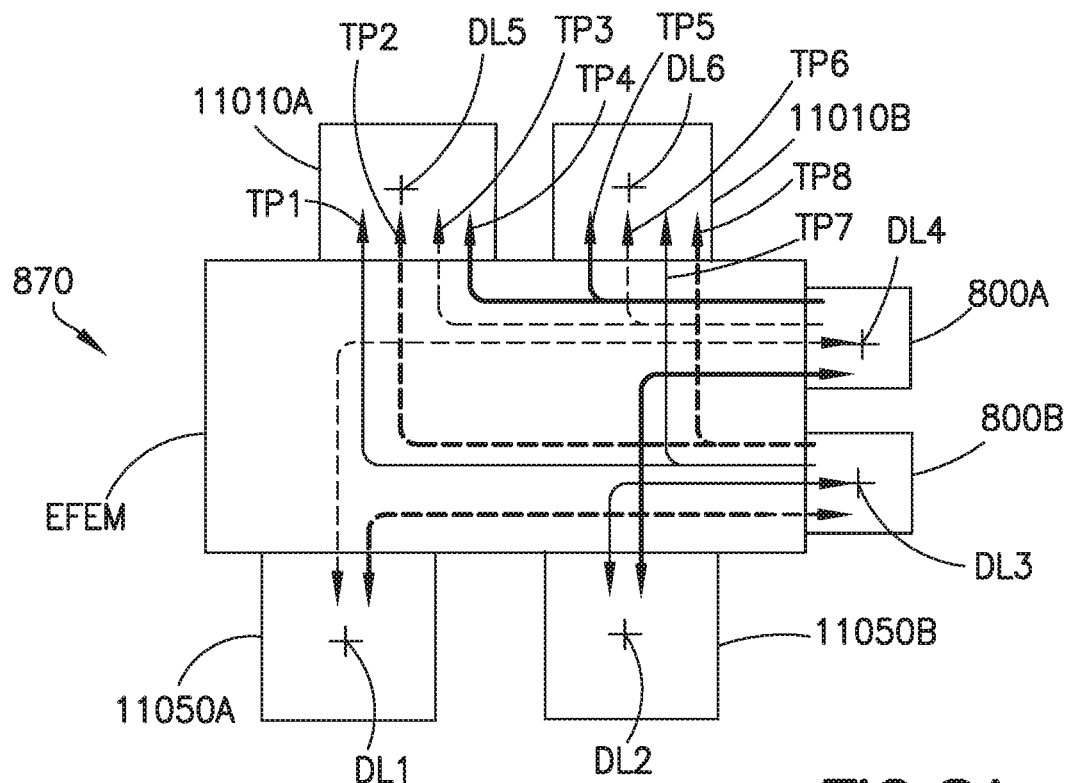
FIG. 8A is a schematic illustration of wafer transport paths in a conventional processing tool.
Figure 8B:
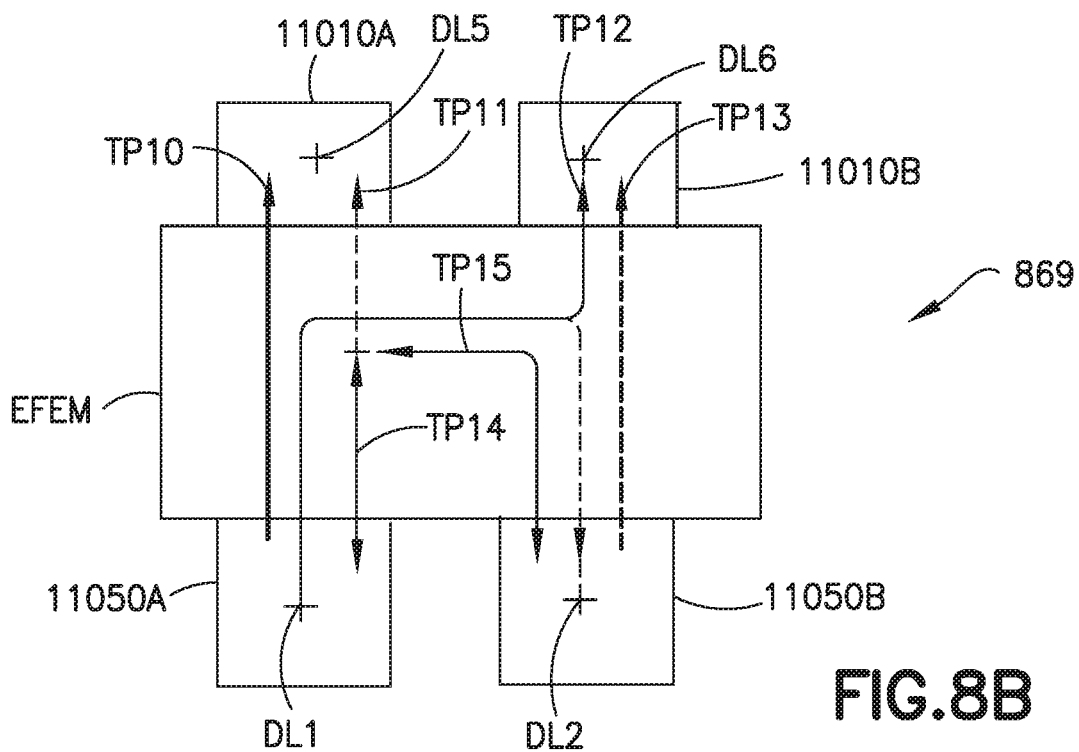
FIG. 8B is a schematic illustration of wafer transport paths in a processing tool incorporating aspects of the disclosed embodiment.

As may be realized, an advantage for on-the-fly alignment as described herein relates to a significantly reduced time that each wafer W spends in, for example, the atmospheric environment of the EFEM 11060 while being sorted, aligned and/or identified. This time reduction is related to the higher throughput rate achievable with the on-the-fly alignment as described herein and/or a significant reduction in the time a given wafer spends away from the protective envelope provided by the wafer cassette 11050. This advantage is especially evident for the common sort recipe that provides for the alignment and/or optical character recognition (OCR) read of all wafers in a given FOUP. For example, referring to FIG. 8A conventional systems 870 generally rely on dual fixed aligners 800A, 800B to achieve high overall throughput rates but this architecture results in more wafer travel distance, robotic motion, and elapsed time spent by each wafer in the minienvironment (adjacent to a high activity SCARA style robot). For example, FIG. 8A illustrates conventional exemplary transfer paths for a transfer of wafers within an EFEM for sorting, aligning and/or identification of the wafers. The wafer transfer paths TP1-TP8 are from a predetermined datum location DL1, DL2 within one of the wafer cassettes 11050A, 11050B to a predetermined datum location DL3, DL4 in one of the fixed aligners 800A, 800B and then to a predetermined datum location DL5, DL6 in one of the load locks 11010A, 11010B or back to the predetermined datum location DL1, DL2 within one of the wafer cassettes 11050A, 11050B. In comparison, FIG. 8B illustrates wafer transport paths TP10-TP13, of a system 869 in accordance with aspects of the disclosed embodiment, for a transfer of wafers within an identical EFEM (to that shown in FIG. 8A) for sorting, aligning and/or identification of the wafers. As can be seen in FIG. 8B any one of the transfer paths TP10-TP15 is shorter in length than any one of the conventional transfer paths TP1-TP8. As may be realized, the transfer paths TP14, TP15 where the wafers W are sorted and placed back in the cassette from which they were picked or an adjacent cassette at an adjacent load port are the shortest paths and are significantly shorter than corresponding paths illustrated in FIG. 8A from the cassettes 11050A, 11050B to one of the aligners 800A, 800B and then back to one of the cassettes 11050A, 11050B. For example, when sorting according to paths TP14, TP15 in FIG. 8B the end effectors 420A, 420B . . . 420n sequentially pick wafers W (so that the wafers are shuffled) from a common cassette, such as cassette 11050A or 11050B. As each wafer is sequentially picked, during retraction of each wafer from the cassette 11050A, 11050B each wafer passes by the sensors 450, 451 to detect the edges of the wafers as described above. The wafers are shuffled on the transport robot to so that each wafer is sequentially aligned. The aligned wafers are placed in a predetermined sorted order into one or more of the cassettes 11050A, 11050B.

Referring to FIG. 9, the time the wafer(s) spend in the atmospheric environment of the EFEM is shorter within the system 869 than with the conventional system 870 using the twin fixed aligners 800A, 800B. For example, the table illustrated in FIG. 9 illustrates transfer operations, each having a specified transfer time, with respect to the conventional transfer/alignment system 870 of FIG. 8A (e.g. the "Conventional Transfer Times"). The table in FIG. 9 also illustrates the transfer operations, each having a specified transfer time, with respect to the transfer/alignment system 869 of FIG. 8B in accordance with the aspects of the disclosed embodiment. As can be seen in the table the conventional transfer/alignment system 870 and the system 869 both include time associated with picking one or more wafers from a wafer cassette 11050A, 11050B and time associated with placing one or more wafers at a load lock 11010A, 11010B however, this is where the similarities in transfer time end. For example, rather than substantially directly transfer a wafer from a cassette 11050A, 11050B to a wafer holding location (where the wafer holding location is one or more of a cassette at the load port from which the wafer was taken, a different cassette at an adjacent load port and a load lock) as is done within the system 869, the conventional system includes additional transfer time for transferring the wafer(s) to and from the predetermined datum location DL3, DL4 of one of the fixed aligners 800A, 800B. In addition, the conventional system 870 includes idle transfer time in which the wafer W is located within the aligner 800A, 800B and being aligned. This "alignment time" is substantially eliminated in the system 869 because the wafer(s) is/are aligned during transfer, while the wafer(s) are located on the end effector(s) of the transport robot, between predetermined datum location DL1, DL2 and predetermined datum location DL5, DL6 (where the wafers are transferred to a load lock) and predetermined datum location DL1, DL2 (where the wafers are returned to the cassette(s) such as during sorting). In addition, even if the wafers are aligned in the system 869 with the transport robot holding the slide body 420 stationary (such as in front of a load lock 11010A, 11010B the time to transfer a wafer from an end effector 420A, 420B . . . 420$n$ to the chuck 460 is significantly less than the time to transfer a wafer from a conventional end effector to the fixed aligner 800A, 800B due to, for example, a shorter travel distance in the Z direction. For example, for performing wafer alignment and identification in accordance with the aspects of the disclosed embodiment the chuck 460 is moved from a fully lowered datum position CD by a small amount Z1 in the Z direction (e.g. about 20 mm or less) and the end effector 420A, 420B . . . 420$n$ is only partially extended in the R direction for transferring a wafer between an end effector and the chuck. In contrast, a robot without the on-the-fly alignment of the aspects of the disclosed embodiments needs to impose much greater Z travel (distance Z2 in FIG. 10) to transfer the wafer W from, for example, a predetermined wafer transfer plane WTP of the EFEM to a level of the wafer support surface WSS of the fixed aligner 800 and must extend the end effector EE fully in the R direction while aligning, for example, a datum CE of the end effector EE with a datum CA of the aligner through additional movement in one or more of the X, Y and θ axes.

As may be realized, the decreased wafer transfer times of the system 869 in accordance with the aspects of the disclosed embodiment allows for a decreased elapsed time in which the door of the wafer cassette is open. This reduced "cassette door open" time reduces, for example, contamination within the cassette from the atmospheric environment as well as provides increased inert gas protection for the inside of the cassette and the wafers located therein. As may be realized, the reduced "cassette door open" time minimizes environmental changes and contamination within the cassette and also reduces inert gas restoration times (and the amount of inert gas needed for restoration) within the cassette. Conversely, the environmental disturbance of the mini-environment in the front end is also reduced. As can be seen from the above, the aspects of the disclosed embodiment described herein not only provide for higher wafer throughput but also improved cleanliness and reduced environmental exposure of the wafers.

In accordance with one or more aspects of the disclosed embodiment a semiconductor wafer transport apparatus includes a frame; a transport arm movably mounted to the frame and having at least one end effector movably mounted to the arm so that the at least one end effector traverses, with the arm as a unit, in a first direction relative to the frame, and traverses linearly, relative to the transport arm, in a second direction; and an edge detection sensor mounted to the transport arm so that the edge detection sensor moves with the transport arm as a unit relative to the frame, the edge detection sensor being a common sensor effecting edge detection of each wafer of more than one wafers simultaneously supported by the at least one end effector; wherein the edge detection sensor is configured so that the edge detection of each wafer is effected by and coincident with the traverse in the second direction of each end effector of the at least one end effector on the transport arm.

In accordance with one or more aspects of the disclosed embodiment the traverse of each end effector in the second direction linearly transports a corresponding wafer, seated on the end effector, of the more than one wafers simultaneously supported by the at least one end effector, relative to the edge detection sensor effecting edge detection.

In accordance with one or more aspects of the disclosed embodiment the edge detection sensor is configured to detect an edge of the wafer and identify therefrom a wafer location and misalignment with respect to a predetermined reference frame.

In accordance with one or more aspects of the disclosed embodiment the semiconductor wafer transport apparatus further includes a wafer aligner mounted to the transport arm so that the aligner and the transport arm move as a unit relative to the frame, the aligner being disposed to cooperate with each end effector and effect wafer alignment of the corresponding wafer seated on the end effector.

In accordance with one or more aspects of the disclosed embodiment the semiconductor wafer transport apparatus further includes a controller configured to cycle a linear traverse of each end effector past the edge detection sensor and effect edge detection of each corresponding wafer.

In accordance with one or more aspects of the disclosed embodiment the controller is configured to sequentially cycle the linear traverse of all end effectors before engaging a first wafer with a wafer aligner mounted to the transport arm.

In accordance with one or more aspects of the disclosed embodiment each end effector has an independent drive configured so that each end effector has independent linear traverse in the second direction.

In accordance with one or more aspects of the disclosed embodiment the at least one end effector includes a first end effector and a second end effector, each being independently driven relative to the transport arm.

In accordance with one or more aspects of the disclosed embodiment the edge detection is an on the fly edge detection.

In accordance with one or more aspects of the disclosed embodiment a wafer processing apparatus comprises an enclosure with a load port and the transport apparatus as described above.

In accordance with one or more aspects of the disclosed embodiment a semiconductor wafer transport apparatus includes a frame; a transport arm movably mounted to the frame and having a first end effector and a second end effector movably mounted to the arm so that the first end effector and second end effector traverse, with the arm as a unit, in a first direction relative to the frame, and, the first end effector and second end effector are independently driven for independent linear traverse, relative to the transport arm, in a second direction; and an edge detection sensor mounted to the transport arm so that the edge detection sensor moves with the transport arm as a unit relative to the frame, the edge detection sensor being a common sensor effecting edge detection of each wafer of more than one wafers simultaneously supported by the first end effector and second end effector; wherein the edge detection sensor is configured so that the edge detection of each wafer is effected by and coincident with the traverse in the second direction of each end effector of the first end effector and second end effector on the transport arm.

In accordance with one or more aspects of the disclosed embodiment the traverse of each end effector in the second direction linearly transports a corresponding wafer, seated on a respective end effector, of the more than one wafers simultaneously supported by the first end effector and the second end effector, relative to the edge detection sensor effecting edge detection.

In accordance with one or more aspects of the disclosed embodiment the edge detection sensor is configured to detect an edge of the wafer and identify therefrom a wafer location and misalignment with respect to a predetermined reference frame.

In accordance with one or more aspects of the disclosed embodiment the semiconductor wafer transport apparatus further includes a wafer aligner mounted to the transport arm so that the aligner and the transport arm move as a unit relative to the frame, the aligner being disposed to cooperate with each end effector and effect wafer alignment of the corresponding wafer seated on a respective one of the first end effector and the second end effector.

In accordance with one or more aspects of the disclosed embodiment the semiconductor wafer transport apparatus further includes a controller configured to cycle a linear traverse of each end effector past the edge detection sensor and effect edge detection of each corresponding wafer.

In accordance with one or more aspects of the disclosed embodiment the controller is configured to sequentially cycle the linear traverse of all end effectors before engaging a first wafer with a wafer aligner mounted to the transport arm.

In accordance with one or more aspects of the disclosed embodiment each end effector has an independent drive configured to effect the independent linear traverse of each end effector in the second direction.

In accordance with one or more aspects of the disclosed embodiment the edge detection is an on the fly edge detection.

In accordance with one or more aspects of the disclosed embodiment a wafer processing apparatus includes an enclosure with a load lock and the transport apparatus as described above.

In accordance with one or more aspects of the disclosed embodiment a method of processing a semiconductor wafer includes providing a transport arm movably mounted to a frame; providing at least one end effector movably mounted to the arm so that the at least one end effector traverses, with the arm as a unit, in a first direction relative to the frame, and traverses linearly, relative to the transport arm, in a second direction; and sequentially cycling linear traversal of each end effector of the at least one end effector in the second direction so that more than one wafers are each sequentially shuffled and scanned by a common edge detection sensor, mounted to the transport arm, during the sequential cycling of the linear traversal of each end effector.

In accordance with one or more aspects of the disclosed embodiment scanning by the common edge detection sensor during the sequential shuffle effects on the fly edge detection of each wafer of the more than one wafers simultaneously supported by the at least one end effector where the common edge detection sensor is mounted to the transport arm so that the common edge detection sensor moves with the transport arm as a unit relative to the frame.

In accordance with one or more aspects of the disclosed embodiment the method further includes engaging a first wafer with a wafer aligner mounted to the transport arm after completion of the sequential shuffling of the more than one wafers.

In accordance with one or more aspects of the disclosed embodiment the on the fly edge detection of each wafer is effected by and coincident with the traverse in the second direction of each end effector of the at least one end effectors on the transport arm.

In accordance with one or more aspects of the disclosed embodiment the method further includes effecting edge detection during the sequential shuffle, by traversing each end effector in the second direction linearly to transport a corresponding wafer, seated on the end effector, of the more than one wafers simultaneously supported by the at least one end effector, relative to the edge detection sensor and scanning the corresponding wafer with the edge detection sensor during linear transport of the corresponding wafer.

In accordance with one or more aspects of the disclosed embodiment the method further includes detecting, with the edge detection sensor, an edge of the wafer and identifying therefrom a wafer location and misalignment with respect to a predetermined reference frame.

In accordance with one or more aspects of the disclosed embodiment the method further includes effecting wafer alignment of the corresponding wafer seated on the end effector with a wafer aligner mounted to the transport arm where the wafer aligner and the transport arm move as a unit relative to the frame, the aligner being disposed to cooperate with each end effector.

In accordance with one or more aspects of the disclosed embodiment the method further includes independently driving each end effector with an independent drive so that each end effector has independent linear traverse in the second direction.

In accordance with one or more aspects of the disclosed embodiment the at least one end effector includes a first end effector and a second end effector, the method further comprising independently driving each of the first end effector and second end effector relative to the transport arm.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A semiconductor wafer transport apparatus comprising:
    a frame;
    a transport arm movably mounted to the frame and having at least one end effector movably mounted to the arm so that the at least one end effector traverses, with the arm as a unit, in a first direction relative to the frame, and traverses linearly, relative to a portion of the transport arm adjacent the end effector, in a second direction; and
    an edge detection sensor mounted to the transport arm so that the edge detection sensor moves with the transport arm as a unit relative to the frame, the edge detection sensor being a common sensor effecting edge detection of each wafer of more than one wafers simultaneously supported by the at least one end effector;
    wherein the edge detection sensor is configured so that the edge detection of each wafer is effected by and coincident with the traverse in the second direction of each end effector of the at least one end effector on the transport arm.

2. The semiconductor wafer transport apparatus of claim 1, wherein the traverse of each end effector in the second direction linearly transports a corresponding wafer, seated on the end effector, of the more than one wafers simultaneously supported by the at least one end effector, relative to the edge detection sensor effecting edge detection.

3. The semiconductor wafer transport apparatus of claim 2, wherein the edge detection sensor is configured to detect an edge of the wafer and identify therefrom a wafer location and misalignment with respect to a predetermined reference frame.

4. The semiconductor wafer transport apparatus of claim 2, further comprising a wafer aligner mounted to the transport arm so that the aligner and the transport arm move as a unit relative to the frame, the aligner being disposed to cooperate with each end effector and effect wafer alignment of the corresponding wafer seated on the end effector.

5. The semiconductor wafer transport apparatus of claim 2, further comprising a controller configured to cycle a linear traverse of each end effector past the edge detection sensor and effect edge detection of each corresponding wafer.

6. The semiconductor wafer transport apparatus of claim 5, wherein the controller is configured to sequentially cycle the linear traverse of all end effectors before engaging a first wafer with a wafer aligner mounted to the transport arm.

7. The semiconductor wafer transport apparatus of claim 1, wherein each end effector has an independent drive configured so that each end effector has independent linear traverse in the second direction.

8. The semiconductor wafer transport apparatus of claim 1, wherein the at least one end effector includes a first end effector and a second end effector, each being independently driven relative to the transport arm.

9. The semiconductor wafer transport apparatus of claim 1, wherein the edge detection is an on the fly edge detection.

10. A wafer processing apparatus comprising an enclosure with a load port and the transport apparatus as in claim 1.

11. A semiconductor wafer transport apparatus comprising:
a frame;
a transport arm movably mounted to the frame and having a first end effector and a second end effector movably mounted to the arm so that
the first end effector and second end effector traverse, with the arm as a unit, in a first direction relative to the frame, and,
the first end effector and second end effector are independently driven for independent linear traverse, relative to a portion of the transport arm adjacent the end effector, in a second direction different from the first direction; and
an edge detection sensor mounted to the transport arm so that the edge detection sensor moves with the transport arm as a unit relative to the frame, the edge detection sensor being a common sensor effecting edge detection of each wafer of more than one wafers simultaneously supported by the first end effector and second end effector;
wherein the edge detection sensor is configured so that the edge detection of each wafer is effected by and coincident with the traverse in the second direction of each end effector of the first end effector and second end effector on the transport arm.

12. The semiconductor wafer transport apparatus of claim 11, wherein the traverse of each end effector in the second direction linearly transports a corresponding wafer, seated on a respective end effector, of the more than one wafers simultaneously supported by the first end effector and the second end effector, relative to the edge detection sensor effecting edge detection.

13. The semiconductor wafer transport apparatus of claim 12, wherein the edge detection sensor is configured to detect an edge of the wafer and identify therefrom a wafer location and misalignment with respect to a predetermined reference frame.

14. The semiconductor wafer transport apparatus of claim 12, further comprising a wafer aligner mounted to the transport arm so that the aligner and the transport arm move as a unit relative to the frame, the aligner being disposed to cooperate with each end effector and effect wafer alignment of the corresponding wafer seated on a respective one of the first end effector and the second end effector.

15. The semiconductor wafer transport apparatus of claim 12, further comprising a controller configured to cycle a linear traverse of each end effector past the edge detection sensor and effect edge detection of each corresponding wafer.

16. The semiconductor wafer transport apparatus of claim 15, wherein the controller is configured to sequentially cycle the linear traverse of all end effectors before engaging a first wafer with a wafer aligner mounted to the transport arm.

17. The semiconductor wafer transport apparatus of claim 11, wherein each end effector has an independent drive configured to effect the independent linear traverse of each end effector in the second direction.

18. A wafer processing apparatus comprising an enclosure with a load port and the transport apparatus as in claim 11.

19. The wafer processing apparatus of claim 11, wherein the edge detection is an on the fly edge detection.

* * * * *